(12) United States Patent
Kim et al.

(10) Patent No.: US 12,266,656 B2
(45) Date of Patent: Apr. 1, 2025

(54) SEMICONDUCTOR DEVICE AND METHOD FOR FABRICATING THE SAME

(71) Applicant: SAMSUNG ELECTRONICS CO., LTD., Suwon-si (KR)

(72) Inventors: Mun Hyeon Kim, Hwaseong-si (KR); Sung Min Kim, Incheon (KR); Dae Won Ha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 135 days.

(21) Appl. No.: 17/210,751

(22) Filed: Mar. 24, 2021

(65) Prior Publication Data

US 2022/0037319 A1 Feb. 3, 2022

(30) Foreign Application Priority Data

Jul. 30, 2020 (KR) .................. 10-2020-0095308

(51) Int. Cl.
| | |
|---|---|
| *H01L 27/092* | (2006.01) |
| *H01L 21/02* | (2006.01) |
| *H01L 21/8238* | (2006.01) |
| *H01L 29/06* | (2006.01) |
| *H01L 29/423* | (2006.01) |
| *H01L 29/66* | (2006.01) |

(Continued)

(52) U.S. Cl.
CPC ...... *H01L 27/092* (2013.01); *H01L 21/02532* (2013.01); *H01L 21/02603* (2013.01); *H01L 21/823807* (2013.01); *H01L 29/0673* (2013.01); *H01L 29/42392* (2013.01); *H01L 29/66742* (2013.01); *H01L 29/7848* (2013.01); *H01L 29/78618* (2013.01); *H01L 29/78696* (2013.01)

(58) Field of Classification Search
CPC ............. H01L 27/092; H01L 21/02532; H01L 21/02603; H01L 21/823807; H01L 29/0673; H01L 29/42392; H01L 29/66742; H01L 29/7848; H01L 29/78618; H01L 29/78696; H01L 21/823878
See application file for complete search history.

(56) References Cited

U.S. PATENT DOCUMENTS

| | | |
|---|---|---|
| 9,570,609 B2 | 2/2017 | Obradovic et al. |
| 9,583,583 B2 * | 2/2017 | Sun ..................... H01L 29/0673 |
| 9,748,404 B1 | 8/2017 | Chang et al. |

(Continued)

*Primary Examiner* — Jay C Kim
*Assistant Examiner* — Woo K Lee
(74) *Attorney, Agent, or Firm* — Fish & Richardson P.C.

(57) ABSTRACT

A semiconductor device includes a substrate with first and second regions separated from each other, a laminate structure including at least one sacrificial layer and at least one active layer alternately stacked on the substrate, a first isolation insulating layer on the laminate structure on the first region, a second isolation insulating layer on the laminate structure on the second region, the second isolation insulating layer having a same thickness as the first isolation insulating layer, a first upper active pattern spaced apart from the first isolation insulating layer, a first gate electrode surrounding at least a portion of the first upper active pattern, a second upper active pattern spaced apart from the second isolation insulating layer, and a second gate electrode surrounding at least a portion of the second upper active pattern, wherein top surfaces of the first and second isolation insulating layers are at different heights.

20 Claims, 43 Drawing Sheets

(51) Int. Cl.
    *H01L 29/78*     (2006.01)
    *H01L 29/786*     (2006.01)

(56) References Cited

U.S. PATENT DOCUMENTS

| | | |
|---|---|---|
| 9,911,592 B2 | 3/2018 | Doris et al. |
| 10,032,867 B1 | 7/2018 | Yeung et al. |
| 10,068,970 B2 | 9/2018 | Cheng et al. |
| 10,374,035 B2 | 8/2019 | Cheng et al. |
| 10,396,202 B2 | 8/2019 | Balakrishnan et al. |
| 10,424,580 B2 | 9/2019 | Cappellani et al. |
| 10,593,673 B2 * | 3/2020 | Miao ................ H01L 29/78654 |
| 2018/0053690 A1 * | 2/2018 | Wang ................ H01L 29/66772 |
| 2019/0252266 A1 | 8/2019 | Chen et al. |
| 2019/0393304 A1 | 12/2019 | Guillorn et al. |
| 2020/0373300 A1 * | 11/2020 | Zhang ............... H01L 29/78696 |

* cited by examiner

SEMICONDUCTOR DEVICE AND METHOD FOR FABRICATING THE SAME

CROSS-REFERENCE TO RELATED APPLICATION

Korean Patent Application No. 10-2020-0095308, filed on Jul. 30, 2020, in the Korean Intellectual Property Office, and entitled: "Semiconductor Device and Method for Fabricating the Same," is incorporated by reference herein in its entirety.

BACKGROUND

1. Field

The present disclosure relates to a semiconductor device and a method for fabricating the same.

2. Description of the Related Art

As one of scaling techniques for increasing the density of integrated circuit devices, a multi-gate transistor has been proposed, in which a fin-shaped or a nanowire-shaped silicon body is formed on a substrate, and a gate is formed on the surface of the silicon body. Since the multi-gate transistor uses a three-dimensional (3D) channel, scaling of the multi-gate transistor can be easily achieved. Further, current control capability can be improved without increasing the gate length of the multi-gate transistor. In addition, a short channel effect (SCE) in which the potential of a channel region is affected by a drain voltage can be effectively suppressed.

SUMMARY

Embodiments may be realized by providing a semiconductor device including a substrate having a first region and a second region separated from each other, a laminate structure in which at least one sacrificial layer and at least one active layer are alternately stacked on the substrate, a first isolation insulating layer disposed on the laminate structure on the first region, a second isolation insulating layer disposed on the laminate structure on the second region and having substantially the same thickness as the first isolation insulating layer, a first upper active pattern spaced apart from the first isolation insulating layer, a first gate electrode surrounding at least a part of the first upper active pattern, a second upper active pattern spaced apart from the second isolation insulating layer, and a second gate electrode surrounding at least a part of the second upper active pattern, wherein a top surface of the first isolation insulating layer and a top surface of the second isolation insulating layer are disposed at different heights.

Embodiments may also be realized by providing a semiconductor device including a substrate having a first region and a second region different from each other, a first isolation insulating layer disposed on the first region, a first active pattern disposed on the first isolation insulating layer, a first gate electrode surrounding at least a part of the first active pattern, a second isolation insulating layer disposed on the second region, a second active pattern disposed on the second isolation insulating layer, and a second gate electrode surrounding at least a part of the second active pattern, wherein the first isolation insulating layer and the second isolation insulating layer include different materials.

Embodiments may still be realized by providing a method for fabricating a semiconductor device including forming a laminate structure in which sacrificial layers and active layers are alternately stacked on a substrate including a first region and a second region separated from each other, etching the laminate structure on the first region to form a first stacked structure protruding from a first sacrificial layer among the sacrificial layers, removing the first sacrificial layer and forming a first isolation insulating layer in a space from which the first sacrificial layer has been removed, etching the laminate structure on the second region to form a second stacked structure protruding from a second sacrificial layer among the sacrificial layers, removing the second sacrificial layer and forming a second isolation insulating layer in a space from which the second sacrificial layer has been removed, removing the sacrificial layer included in the first stacked structure and the second stacked structure, and forming a gate electrode in a space from which the sacrificial layer has been removed to form a gate structure, wherein the first isolation insulating layer and the second isolation insulating layer are formed at different heights.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
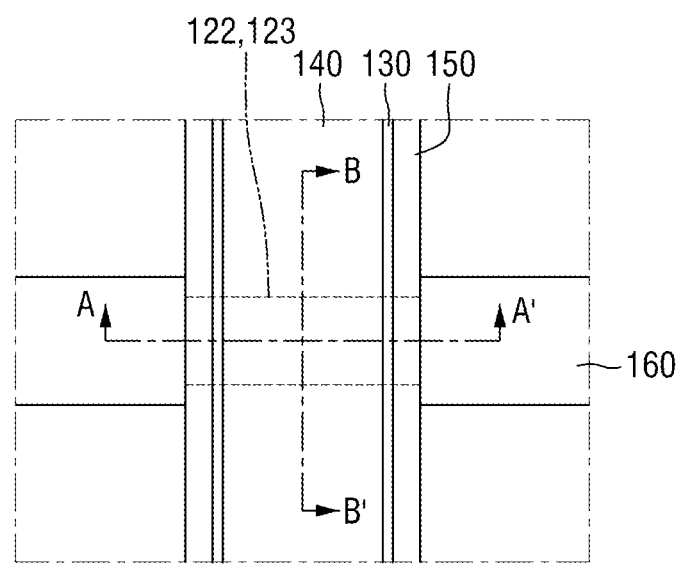
FIG. 1 is a schematic plan view of a semiconductor device according to some embodiments.
Figure 1:
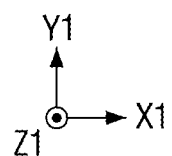
Figure 2:
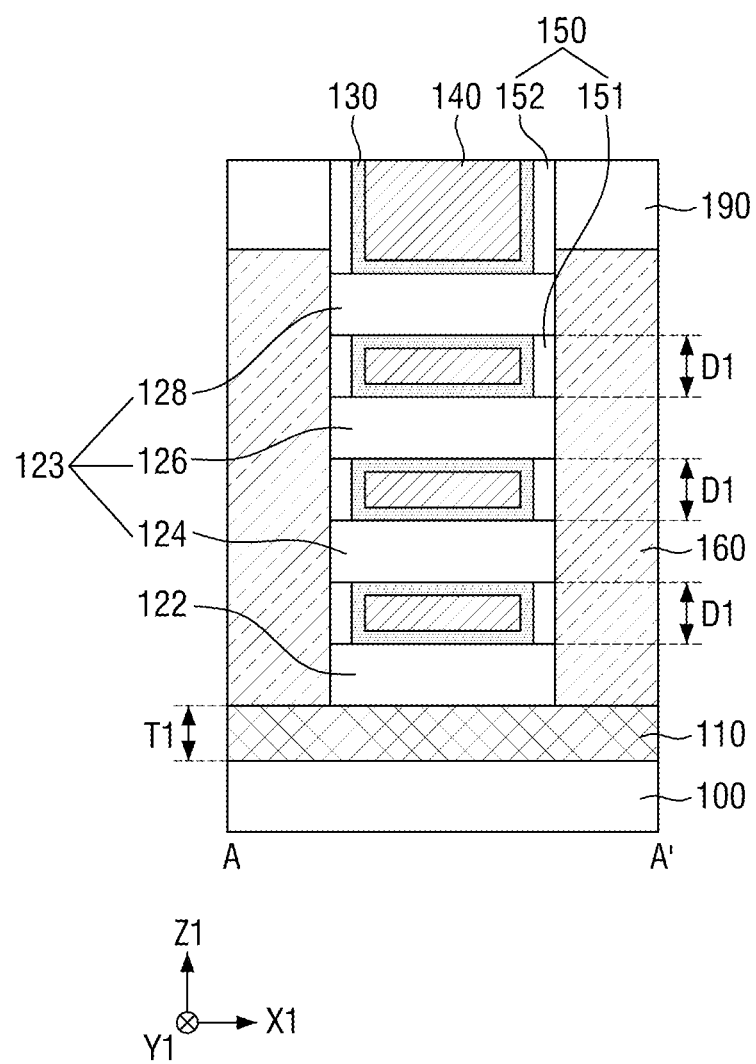
FIG. 2 is a cross-sectional view taken along line A-A' of FIG. 1.
Figure 3:
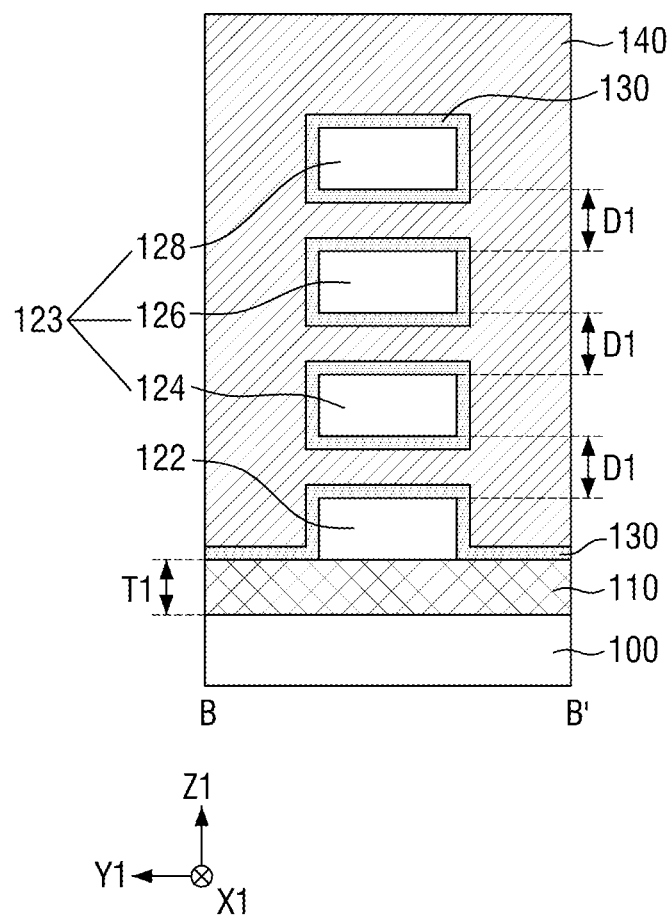
FIG. 3 is a cross-sectional view taken along line B-B' of FIG. 1.

FIG. 1 is a schematic plan view illustrating a semiconductor device according to some embodiments. FIG. 2 is a cross-sectional view taken along line A-A' of FIG. 1. FIG. 3 is a cross-sectional view taken along line B-B' of FIG. 1.

Referring to FIGS. 1 to 3, a semiconductor device according to some embodiments may include a substrate 100, a first isolation insulating layer 110, first active patterns 122 and 123, a first gate dielectric layer 130, a first gate electrode 140, a first gate spacer 150, a first source/drain region 160, and an interlayer insulating layer 190. In some embodiments, the substrate 100 may be a bulk silicon substrate.

The first isolation insulating layer 110 may be disposed on the substrate 100. The first isolation insulating layer 110 may include, e.g., at least one of silicon oxide, silicon oxynitride, silicon nitride or a combination thereof, but the present disclosure is not limited thereto.

The first active patterns 122 and 123 may be disposed on the first isolation insulating layer 110. The first active patterns 122 and 123 may include a first lower active pattern 122 disposed on the first isolation insulating layer 110, and a first upper active pattern 123 disposed on the first lower active pattern 122 The first active patterns 122 and 123 may extend, e.g., in a first direction X1.

The first lower active pattern 122 may be in, e.g., direct, contact with the first isolation insulating layer 110. The first lower active pattern 122 may be an active pattern disposed at a lowermost portion among the first active patterns 122 and 123 penetrating the first gate electrode 140.

The first upper active pattern 123 may be disposed on the first lower active pattern 122. The first upper active pattern 123 may include a plurality of sub-active patterns 124, 126, and 128 sequentially disposed in a thickness direction of the substrate 100, e.g., in a third direction Z10. For example, the first sub-active pattern 124 may be disposed on the first lower active pattern 122, and the second sub-active pattern 126 may be disposed on the first sub-active pattern 124, and the third sub-active pattern 128 may be disposed on the second sub-active pattern 126. The first sub-active pattern 124, the second sub-active pattern 126, and the third sub-active pattern 128 may overlap each other in the third direction Z1.

The first upper active pattern 123 may be spaced apart from the first lower active pattern 122 in the third direction Z1. The first sub-active pattern 124, the second sub-active pattern 126, and the third sub-active pattern 128 may be spaced apart from each other in the third direction Z1. For example, the first sub-active pattern 124 may be spaced apart from the first lower active pattern 122, the second sub-active pattern 126 may be spaced apart from the first sub-active pattern 124, and the third sub-active pattern 128 may be spaced apart from the second sub-active pattern 126.

In some embodiments, the first active patterns 122 and 123 may contain silicon (Si) that is an elemental semiconductor material.

Each of the first active patterns 122 and 123 may be used as a channel region of a transistor including the first gate electrode 140. Although three sub-active patterns of the first upper active pattern 123 are illustrated in FIG. 2 and FIG. 3 for simplicity of description, the present disclosure is not limited thereto. For example, the semiconductor device according to some embodiments may include two or less sub-active patterns or four or more sub-active patterns.

The first gate electrode 140 may be disposed on the first isolation insulating layer 110. The first gate electrode 140 may intersect the first active patterns 122 and 123. For example, the first gate electrode 140 may be parallel to the top surface of the substrate 100 and may be elongated in the second direction Y1.

The first active patterns 122 and 123 may penetrate the first gate electrode 140 while extending in the first direction X1. Accordingly, the first gate electrode 140 may be formed to surround the first upper active pattern 123. Further, the first gate electrode 140 may be formed to surround, e.g., portions of, the first lower active pattern 122 that are not in contact with the first isolation insulating layer 110.

The first gate electrode 140 may include a conductive material. For example, the first gate electrode 140 may include at least one of TiN, WN, TaN, Ru, TiC, TaC, Ti, Ag, Al, TiAl, TiAlN, TiAlC, TaCN, TaSiN, Mn, Zr, W, Al or a combination thereof, but is not limited thereto. The first gate electrode 140 may be formed, e.g., by a replacement process, but is not limited thereto.

Although the first gate electrode 140 that is a single layer is illustrated, this is merely an example, and the first gate electrode 140 may be formed by stacking a plurality of conductive materials. For example, the first gate electrode 140 may include a work function adjusting layer to adjust the work function and a filling conductive layer to fill a space formed by the work function adjusting layer. The work function adjusting layer may include at least one of, e.g., TiN, TaN, TiC, TaC, TiAlC or a combination thereof. The filling conductive layer may include, e.g., W or Al.

The first gate dielectric layer 130 may be interposed between the first gate electrode 140 and each of first active patterns 122 and 123. For example, the first gate dielectric layer 130 may be formed to surround the first upper active pattern 123. The first gate dielectric layer 130 may be formed to surround portions of the first lower active pattern 122 that are not in contact with the first isolation insulating layer 110, e.g., the first gate dielectric layer 130 may not separate between a bottom of the first lower active pattern 122 and the first isolation insulating layer 110. The first gate dielectric layer 130 may extend along the top surface of the first isolation insulating layer 110.

The first gate dielectric layer 130 may include, e.g., at least one of silicon oxide, silicon oxynitride, silicon nitride, or a high-k material having a higher dielectric constant than silicon oxide. The high-k material may include, e.g., at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and a combination thereof, but is not limited thereto.

An interface layer may be formed between each of the first active patterns 122 and 123 and the first gate dielectric layer 130. The interface layer may be formed to surround the first upper active pattern 123 and to surround portions of the first lower active pattern 122 that are not in contact with the first isolation insulating layer 110, and may extend along the top surface of the first isolation insulating layer 110. However, the present disclosure is not limited thereto.

The first source/drain region 160 may be formed on the first isolation insulating layer 110. Further, the first source/drain region 160 may be disposed on the side surface of the first gate electrode 140. For example, the first source/drain region 160 may be disposed on both, e.g., opposite, side surfaces of the first gate electrode 140.

The first source/drain region 160 may be spaced, e.g., separated, apart from the first gate electrode 140 by the first gate spacer 150 to be described later. Further, the first source/drain region 160 may be, e.g., directly, connected to the first active patterns 122 and 123. For example, the first active patterns 122 and 123 may be connected to the first source/drain region 160 while penetrating the first gate spacer 150. The first source/drain region 160 may be used as a source/drain region of a transistor including the first gate electrode 140.

The first source/drain region 160 may include an epitaxial layer formed on the substrate 100. For example, the first source/drain region 160 may be formed by an epitaxial growth method. Although the first source/drain region 160 that is a single layer is illustrated, this is merely an example and the first source/drain region 160 may be formed by stacking a plurality of epitaxial layers. For example, the first source/drain region 160 may include a plurality of epitaxial layers having different impurity concentrations, which are sequentially stacked on the isolation insulating layer 110.

In some embodiments, the first source/drain region 160 may be a raised source/drain region including a top surface protruding more upward than the top surface of the substrate 100. The first source/drain region 160 may protrude more upward than the topmost surface of the first upper active pattern 123 penetrating the first gate electrode 140. For example, the top surface of the first source/drain region 160 may protrude more upward than the top surface of the third sub-active pattern 128.

In the case where the semiconductor device according to some embodiments is an NMOS transistor, the first source/drain region 160 may include n-type impurities or impurities for preventing the diffusion of n-type impurities. For example, the first source/drain region 160 may contain at least one of P, Sb, As, or a combination thereof.

In addition, when the semiconductor device according to some embodiments is an NMOS transistor, the first source/drain region 160 may include a tensile stress material. For example, when the first active patterns 122 and 123 are made of silicon (Si), the first source/drain region 160 may include a material, e.g., SiC, having a smaller lattice constant than silicon (Si). The tensile stress material may apply tensile stress to the first active patterns 122 and 123 to improve the mobility of carriers in the channel region.

Alternatively, when the semiconductor device according to some embodiments is a PMOS transistor, the first source/drain region 160 may include p-type impurities or impurities for preventing the diffusion of p-type impurities. For example, the first source/drain region 160 may include at least one of B, C, In, Ga, Al or a combination thereof.

In addition, when the semiconductor device according to some embodiments is a PMOS transistor, the first source/drain region 160 may include a compressive stress material. For example, when the first active patterns 122 and 123 are made of silicon (Si), the first source/drain region 160 may include a material having a larger lattice constant than silicon (Si). For example, the first source/drain region 160 may include SiGe. The compressive stress material may apply compressive stress to the first active patterns 122 and 123 to improve the mobility of carriers in the channel region.

The first gate spacer 150 may be disposed on the isolation insulating layer 110. The first gate spacer 150 may extend along the side surface of the first gate electrode 140. The first gate spacer 150 may electrically insulate the first gate electrode 140 from the first source/drain region 160.

The first active patterns 122 and 123 may penetrate the first gate spacer 150 while extending in the first direction X1. The first gate spacer 150 may be disposed at the ends of the first active patterns 122 and 123. Accordingly, the first gate space 150 may be formed to surround the ends of the first active patterns 122 and 123.

The first gate spacer 150 may include first inner spacers 151 and a first outer spacer 152. The first inner spacers 151 may be disposed between the first lower active pattern 122 and the first sub-active pattern 124, between the first sub-active pattern 124 and the second sub-active pattern 126, and between the second sub-active pattern 126 and the third sub-upper active pattern 128.

The first inner spacers 151 may be disposed at positions vertically overlapping the first active patterns 122 and 123. The first outer spacer 152 may be disposed on the third sub-active pattern 128 disposed at an uppermost portion among the first active patterns 122 and 123, e.g., the third sub-active pattern 128 may be between the first outer spacer 152 and a topmost of the first inner spacers 151.

The first inner spacer 151 may include, e.g., at least one of silicon nitride (SiN), silicon oxynitride (SiON), silicon oxide ($SiO_2$), silicon oxynitride (SiOCN), silicon boron nitride (SiBN), silicon oxyboron nitride (SiOBN), silicon oxycarbide (SiOC) or a combination thereof. The first outer spacer 152 may include, e.g., at least one of silicon nitride (SiN), silicon oxynitride (SiON), silicon oxide ($SiO_2$), silicon oxycarbonitride (SiOCN) or a combination thereof. The first inner spacer 151 and the first outer spacer 152 may contain different materials, or may contain the same material.

In some embodiments, the first lower active pattern 122 and the first sub-active pattern 124 may be spaced apart from each other by a first distance D1, e.g., along the direction Z1, the first sub-active pattern 124 and the second sub-active pattern 126 may be spaced apart from each other by the first distance D1, e.g., along the direction Z1, and the second sub-active pattern 126 and the third sub-active pattern 128 may be spaced apart from each other by the first distance D1, e.g., along the direction Z1. A thickness T1 of the first isolation insulating layer 110, e.g., along the direction Z1, may be substantially the same as the distance D1 between the first lower active pattern 122 and the first sub-active pattern 124.

The interlayer insulating layer 190 may be disposed on the first isolation insulating layer 110 and the first source/drain region 160. The interlayer insulating layer 190 may surround the sidewall of the first gate spacer 150. The interlayer insulating layer 190 may be formed to fill the space on the side surface of the first gate electrode 140.

The interlayer insulating layer 190 may include, e.g., at least one of silicon oxide, silicon nitride, silicon oxynitride, or a low-k dielectric material. The low-k dielectric material may include, for example, at least one of flowable oxide (FOX), Tonen Silazene (TOSZ), undoped silicate glass (USG), borosilicate glass (BSG), phosphosilicate glass (PSG), borophosphosilicate glass (BPSG), plasma enhanced tetra ethyl ortho silicate (PETEOS), fluoride silicate glass (FSG), carbon doped silicon oxide (CDO), Xerogel, Aerogel, amorphous fluorinated carbon, organo silicate glass (OSG), parylene, bis-benzocyclobutene (BCB), SiLK, polyimide, a porous polymeric material, or a combination thereof, but is not limited thereto.

During fabrication of a semiconductor device including an active pattern directly on a bulk silicon substrate, e.g., without an insulator therebetween, fins are formed on the substrate. Accordingly, since a punch through may occur, a punch through stopper may be formed on the fins to reduce or prevent the punch through. While the punch through stopper may reduce the punch through, the fins may have higher threshold voltages than those of the active patterns due to the punch through stopper, thereby deteriorating performance of the semiconductor device.

In contrast, while the semiconductor device according to some embodiments does not include a silicon-on-insulator (SOI) substrate, the lower portions of the active patterns may be insulated from the substrate 100 by the first isolation insulating layer 110. Further, the active patterns are formed on the first isolation insulating layer 110, and fins are not included. Accordingly, the first isolation insulating layer 110 may apply stress to the active pattern, which makes it possible to reduce or prevent punch through. In addition, the performance of the semiconductor device can be improved or enhanced.

Figure 4:
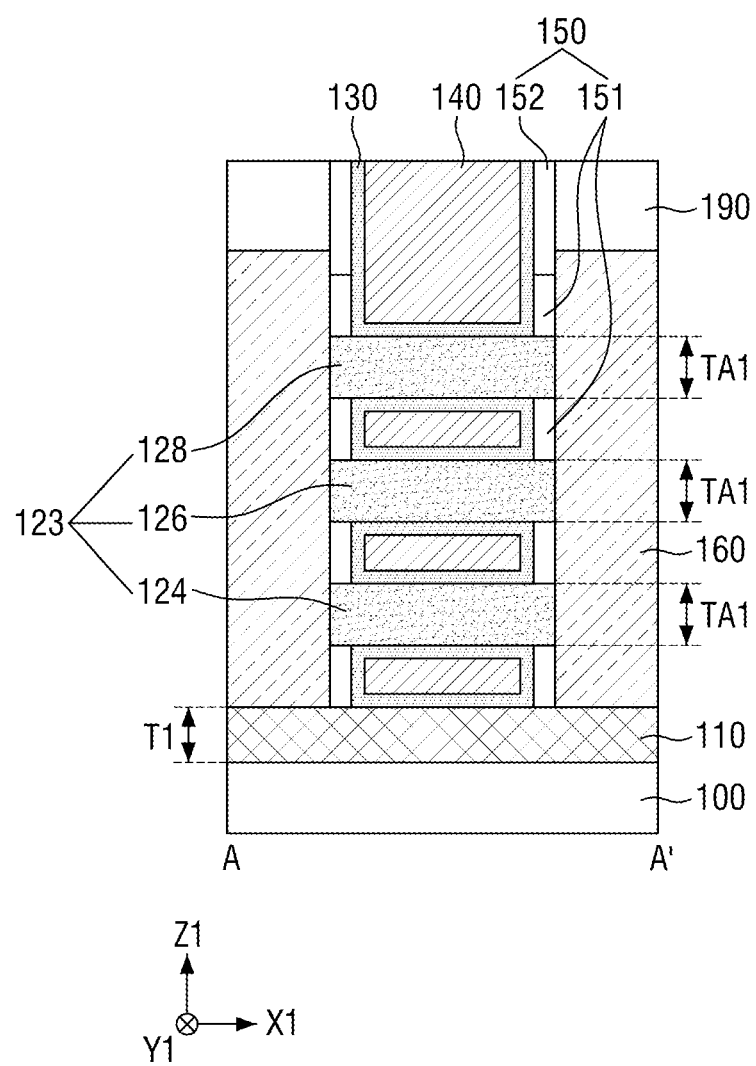
FIG. 4 is a cross-sectional view taken along line A-A' of FIG. 1, according to some embodiments.
Figure 5:
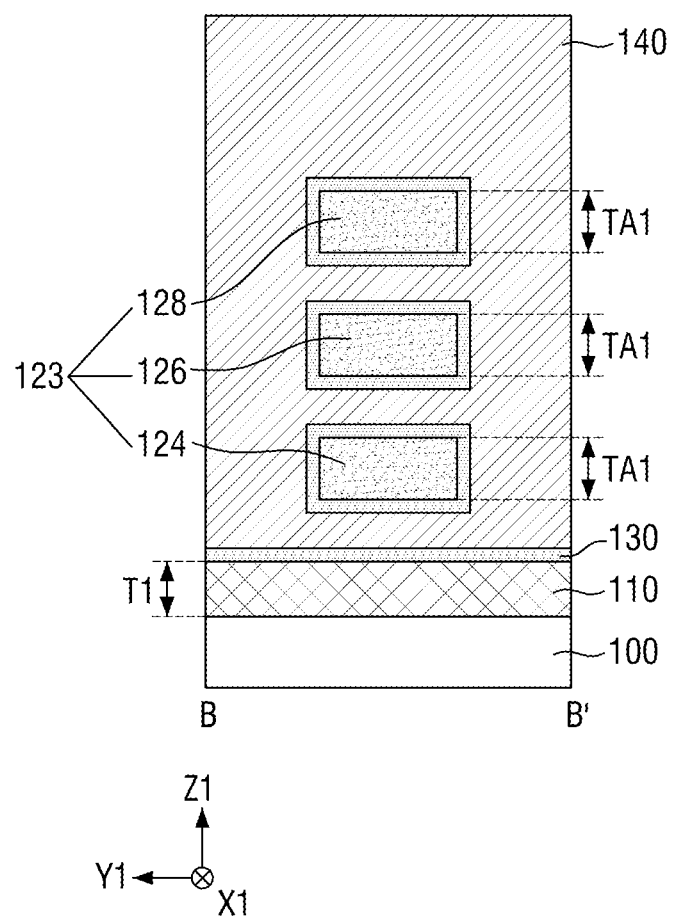
FIG. 5 is a cross-sectional view taken along line B-B' of FIG. 1, according to some embodiments.

FIGS. 4 and 5 are cross-sectional views illustrating a semiconductor device according to some other embodiments. FIG. 4 is a cross-sectional view taken along line A-A' of FIG. 1. FIG. 5 is a cross-sectional view taken along line B-B' of FIG. 1. For simplicity of description, descriptions of features described previously with reference to FIGS. 2 and 3 will be omitted or described only briefly.

Referring to FIGS. 4 and 5, a semiconductor device according to some other embodiments may include the first active pattern 123.

The first active pattern 123 may include the first to third sub-active patterns 124, 126, and 128 spaced apart from the first isolation insulating layer 110. For example, the first sub-active pattern 124 may be spaced apart from the first isolation insulating layer 110, the second sub-active pattern 126 may be spaced apart from the first sub-active pattern 124, and the third sub-active pattern 128 may be spaced apart from the second sub-active pattern 126. In other words, the first sub-active pattern 124 may be a first active pattern on the first isolation insulating layer 110, i.e., without the first lower active pattern 122 of FIGS. 2 and 3. In some embodiments, the first active pattern 123 may contain silicon germanium (SiGe).

In some embodiments, the first to third sub-active patterns 124, 126 and 128 may have the same thickness TA1, e.g., along the direction Z1. The thickness T1 of the first isolation insulating layer 110 may be substantially the same as the thickness TA1 of each of the first to third sub-active patterns 123, 126, and 128.

Figure 6:
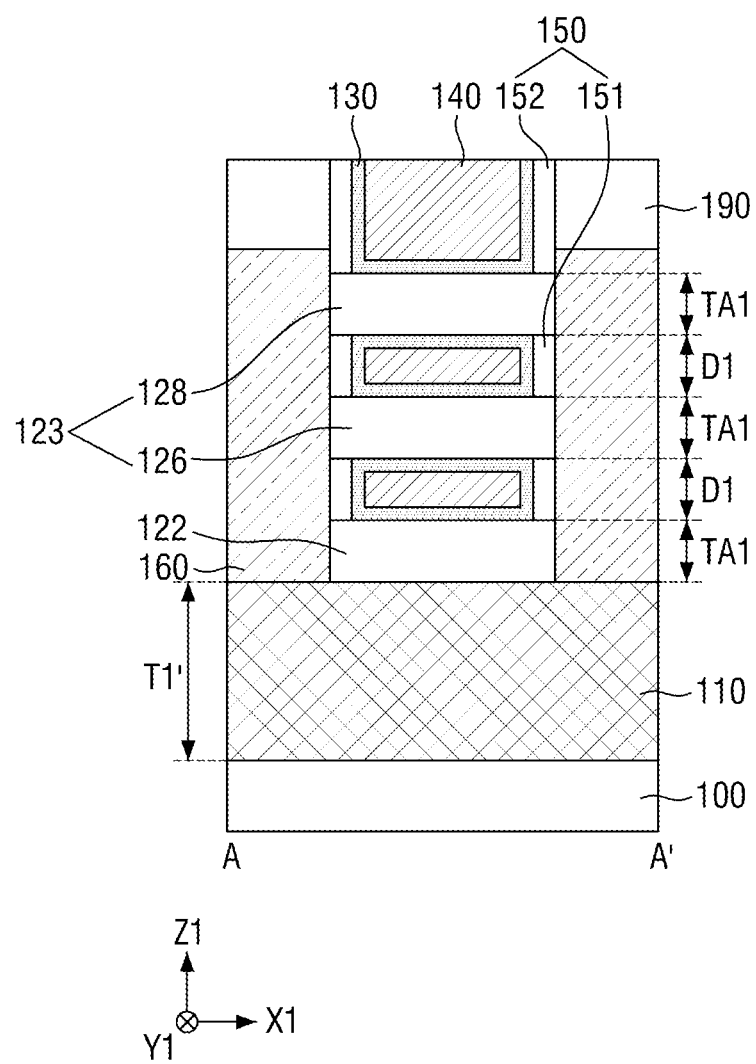
FIG. 6 is a cross-sectional view taken along line A-A' of FIG. 1, according to some embodiments.
Figure 7:
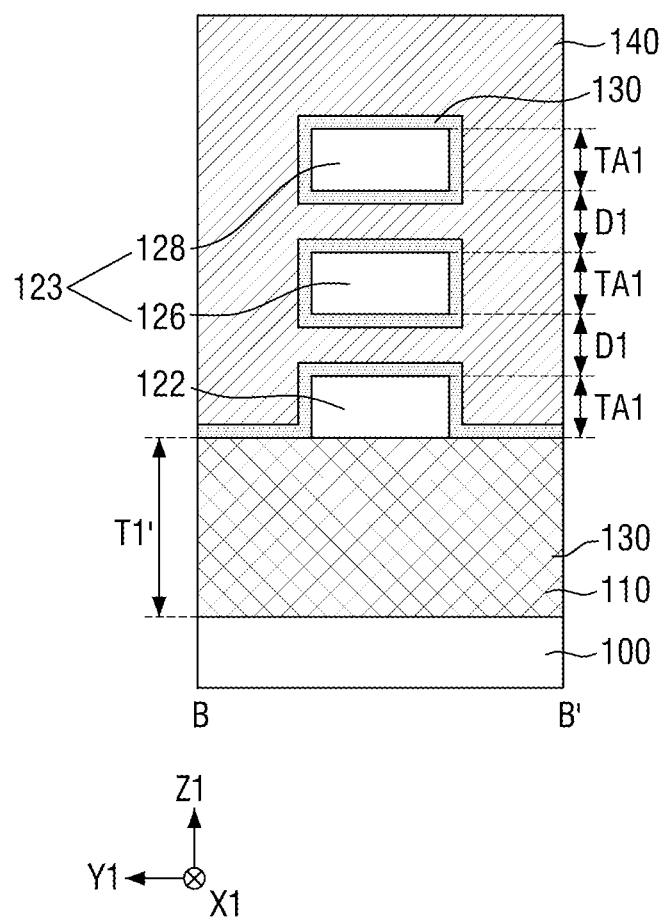
FIG. 7 is a cross-sectional view taken along line B-B' of FIG. 1, according to some embodiments.

FIGS. 6 and 7 are cross-sectional views illustrating a semiconductor device according to some other embodiments. FIG. 6 is a cross-sectional view taken along line A-A' of FIG. 1. FIG. 7 is a cross-sectional view taken along line B-B' of FIG. 1. For simplicity of description, descriptions of features described previously with reference to FIGS. 2 and 3 will be omitted or described only briefly.

Referring to FIGS. 6 and 7, in the semiconductor device according to some other embodiments, the first active pattern 122 may contain silicon (Si). The first active patterns 122 and 123 may include the first lower active pattern 122 disposed on the first isolation insulating layer 110, and the first upper active pattern 123 spaced apart from the first lower active pattern 122. For example, when the first active pattern 123 contains silicon germanium (SiGe), the first lower active pattern 122 may be omitted unlike the drawing.

A thickness T1' of the first isolation insulating layer 110, e.g., along the direction Z1, may be greater than the thickness TA1 of each of the first active patterns 122 and 123 and the distance D1 between the first active patterns 122 and 123.

Figure 8:
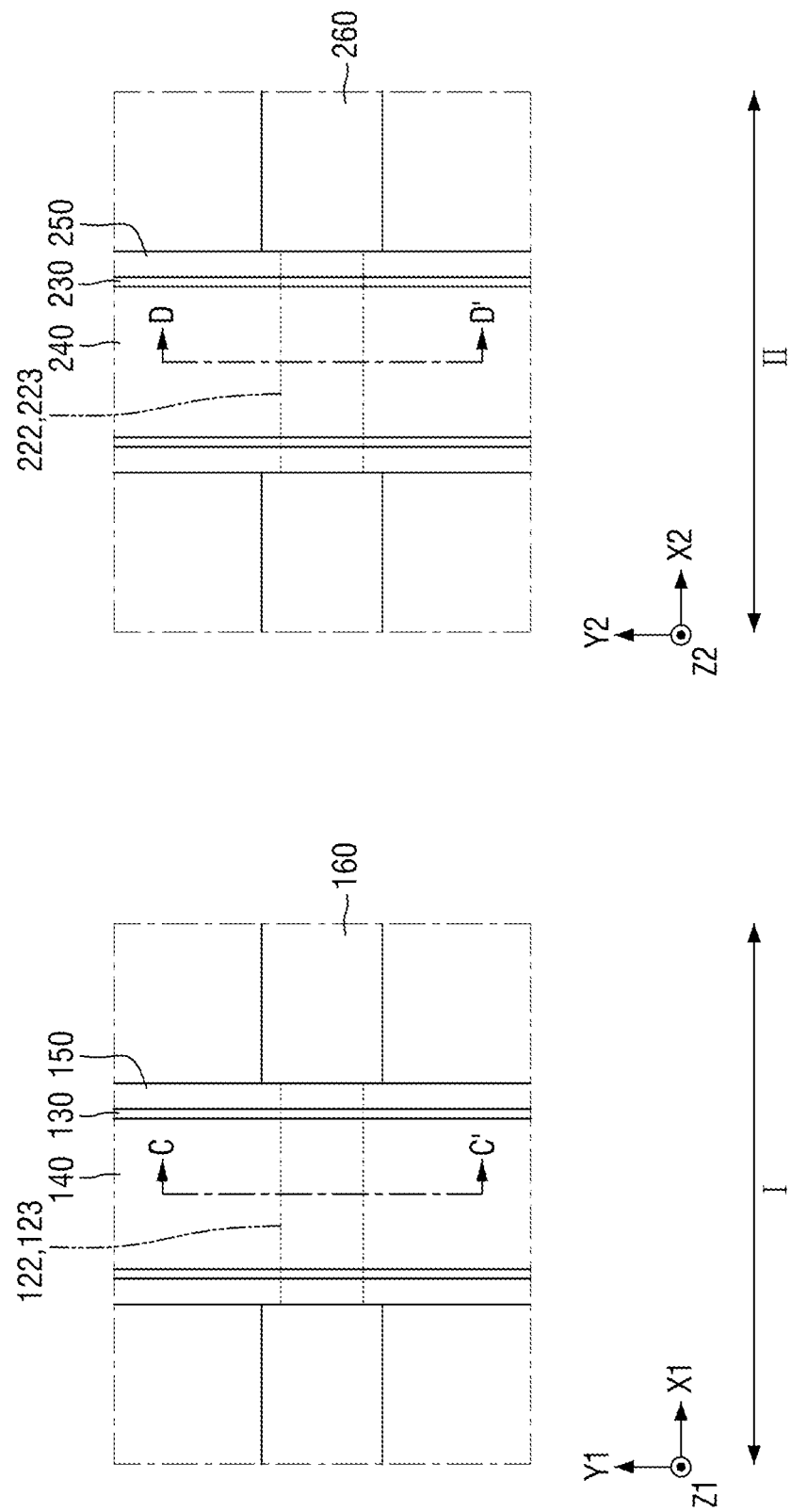
FIG. 8 is a schematic plan view of a semiconductor device according to some other embodiments.
Figure 9:
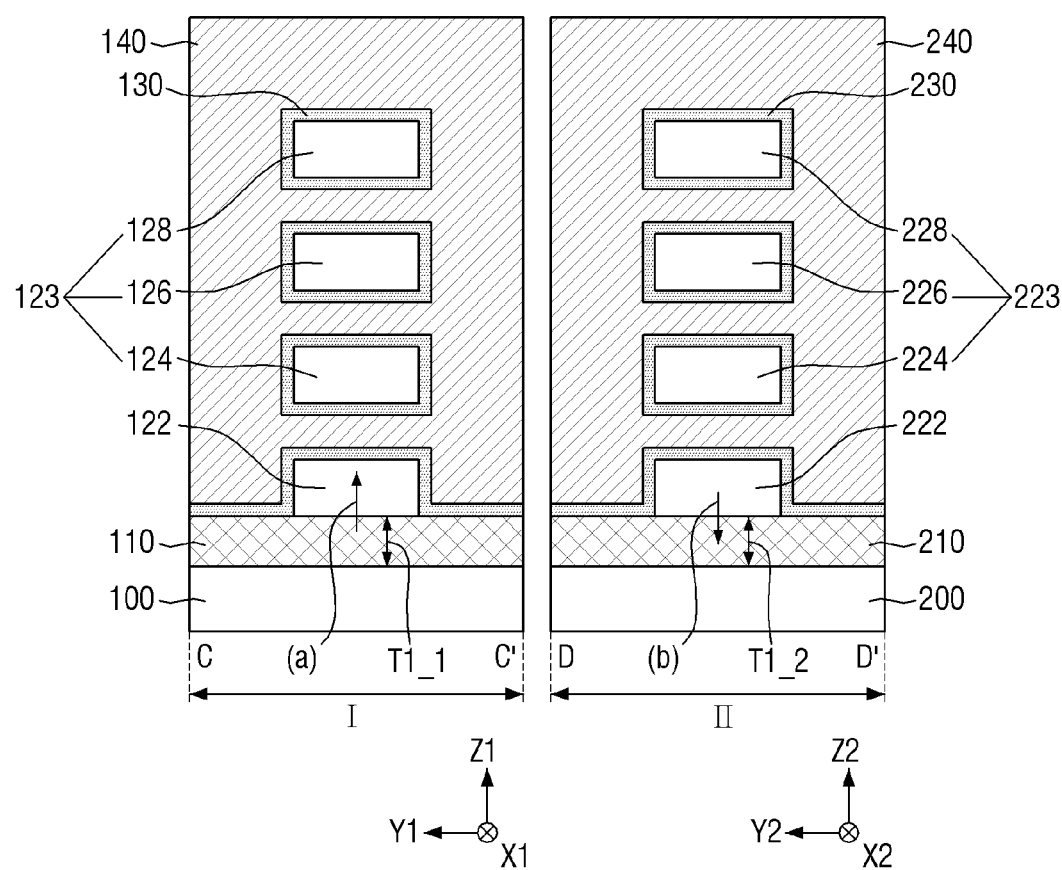
FIG. 9 is a cross-sectional view taken along lines C-C' and D-D' of FIG. 8.
Figure 10A:
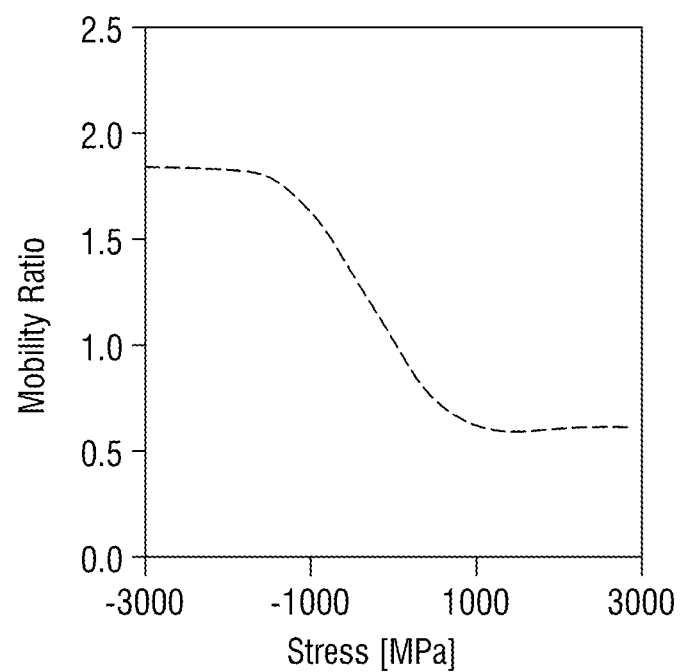
FIGS. 10A and 10B are graphs showing electron mobility and hole mobility with respect to vertical stress applied to a channel, respectively.
Figure 10B:
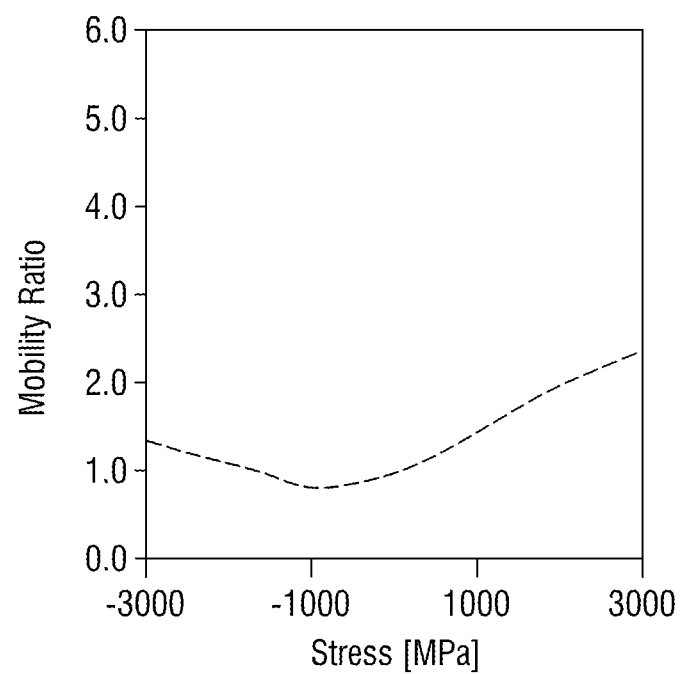

FIG. 8 is a schematic plan view illustrating a semiconductor device according to some other embodiments. FIG. 9 is a cross-sectional view taken along lines C-C' and D-D' of FIG. 8. FIGS. 10A and 10B are graphs showing electron mobility and hole mobility with respect to vertical stress applied to a channel, respectively. For simplicity of description, descriptions of features described previously with reference to FIGS. 2 and 3 will be omitted or described only briefly.

Referring to FIGS. 8 to 10B, in the semiconductor device according to some other embodiments, the substrate 100 may include a first region I and a second region II different from each other. The first region I and the second region II of the substrate 100 may be adjacent to each other or may be spaced apart from each other. The first region I and the second region II of the substrate 100 may be, e.g., horizontally separated regions.

Different types of transistors may be formed in the first region I and the second region II of the substrate 100. In some embodiments, when an NMOS transistor is formed in the first region I of the substrate 100, a PMOS transistor may be formed in the second region II of the substrate 100.

A first isolation insulating layer 110 may be disposed on the first region I of the substrate 100. First active patterns 122 and 123 may be disposed on the first isolation insulating layer 110. The first lower active pattern 122 may be in contact with the first isolation insulating layer 110, and the first upper active pattern 123 may be spaced apart from the first isolation insulating layer 110.

The first gate electrode 140 may be disposed on the first isolation insulating layer 110. The first gate electrode 140 may be formed to surround the first active patterns 122 and 123. The first gate dielectric layer 130 may be interposed between the first active patterns 122 and 123 and the first gate electrode 140.

A second isolation insulating layer 210 may be disposed on the second region II of the substrate 100. Second active patterns 222 and 223 may be disposed on the second isolation insulating layer 210. The second lower active pattern 222 may be in, e.g., direct, contact with the second isolation insulating layer 210, and the second upper active pattern 223 may be spaced apart from the second isolation insulating layer 210.

A second gate electrode 240 may be disposed on the second isolation insulating layer 210. The second gate electrode 240 may be formed to surround the second active patterns 222 and 223. A second gate dielectric layer 230 may be interposed between the second active patterns 222 and 223 and the second gate electrode 240.

A second gate spacer 250 may be disposed on the second isolation insulating layer 210. The second gate spacer 250 may extend along the side surface of the second gate electrode 240. The second gate spacer 250 may electrically insulate the second gate electrode 240 from a second source/drain region 260.

In some embodiments, a thickness T1_1 of the first isolation insulating layer 110 may be substantially the same as a thickness T1_2 of the second isolation insulating layer 210. The first isolation insulating layer 110 and the second isolation insulating layer 210 may contain different materials. Accordingly, the stress applied to the first active patterns 122 and 123 by the first isolation insulating layer 110 and the stress applied to the second active patterns 222 and 223 by the second isolation insulating layer 210 may have different directions.

In detail, the first isolation insulating layer 110 may apply compressive vertical stress (a) to the first lower active pattern 122. In other words, the first isolation insulating layer 110 may apply the stress from the first isolation insulating layer 110 toward the first lower active pattern 122.

The second isolation insulating layer 210 may apply tensile vertical stress (b) to the second lower active pattern 222. In other words, the second isolation insulating layer 210 may apply the stress from the second lower active pattern 222 toward the second isolation insulating layer 210.

FIG. 10A is a graph showing the electron mobility with respect to vertical stress applied to a channel containing silicon. FIG. 10B is a graph showing the hole mobility with respect to vertical stress applied to silicon. Vertical stress having a negative value means compressive stress, and vertical stress having a positive value means tensile stress.

Referring to FIG. 10A, the electron mobility increases as the compressive vertical stress is applied to the channel, e.g., electron mobility ratio increases as the compressive vertical stress (negative values on the graph) increases. Referring to FIG. 10B, the hole mobility increases as the tensile vertical stress is applied to the channel, e.g., the hole mobility ratio increases as the tensile vertical stress (positive values on the graph) increases.

Therefore, in the semiconductor device according to some embodiments, an NMOS transistor is formed in the first region I and the first isolation insulating layer 110 applies the compressive vertical stress (a) to the first active patterns 122 and 123, so that the electron mobility in the first active patterns 122 and 123 may be increased. In addition, a PMOS transistor is formed in the second region II and the second isolation insulating layer 210 applies the tensile vertical stress (b) to the second active patterns 222 and 223, so that the hole mobility in the second active patterns 222 and 223 may be increased.

Accordingly, the semiconductor device may apply stress to the first active patterns 122 and 123 and the second active patterns 222 and 223 in the vertical direction (e.g., third directions Z1 and Z2) as well as in the horizontal direction (e.g., first directions X1 and X2). In detail, it is possible to apply the stress to the first active patterns 122 and 123 in the horizontal direction (e.g., the first direction X1) depending on the material contained in the first source/drain region 160, and also possible to apply the stress to the first active patterns 122 and 123 in the vertical direction (e.g., the third direction Z1) depending on the material contained in the first isolation insulating layer 110. In addition, it is possible to apply the stress to the second active patterns 222 and 223 in the horizontal direction (e.g., the first direction X2) depending on the material contained in the second source/drain region 260, and also possible to apply the stress to the second active patterns 222 and 223 in the vertical direction (e.g., the third direction Z2) depending on the material contained in the second isolation insulating layer 210. Accordingly, the semiconductor device according to some other embodiments can apply stress to the active patterns more effectively compared to a semiconductor device formed on an SOI substrate and including active patterns. Therefore, the performance of the semiconductor device according to embodiments may be improved or enhanced.

Figure 11:
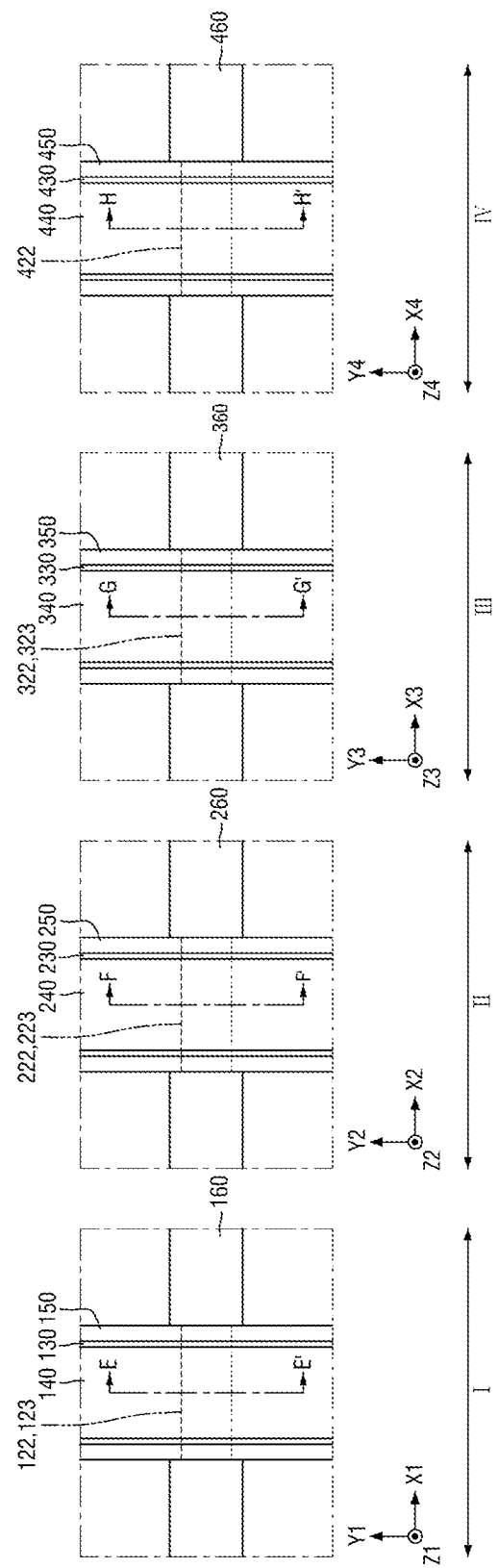
FIG. 11 is a schematic plan view illustrating a semiconductor device according to some other embodiments.
Figure 12:
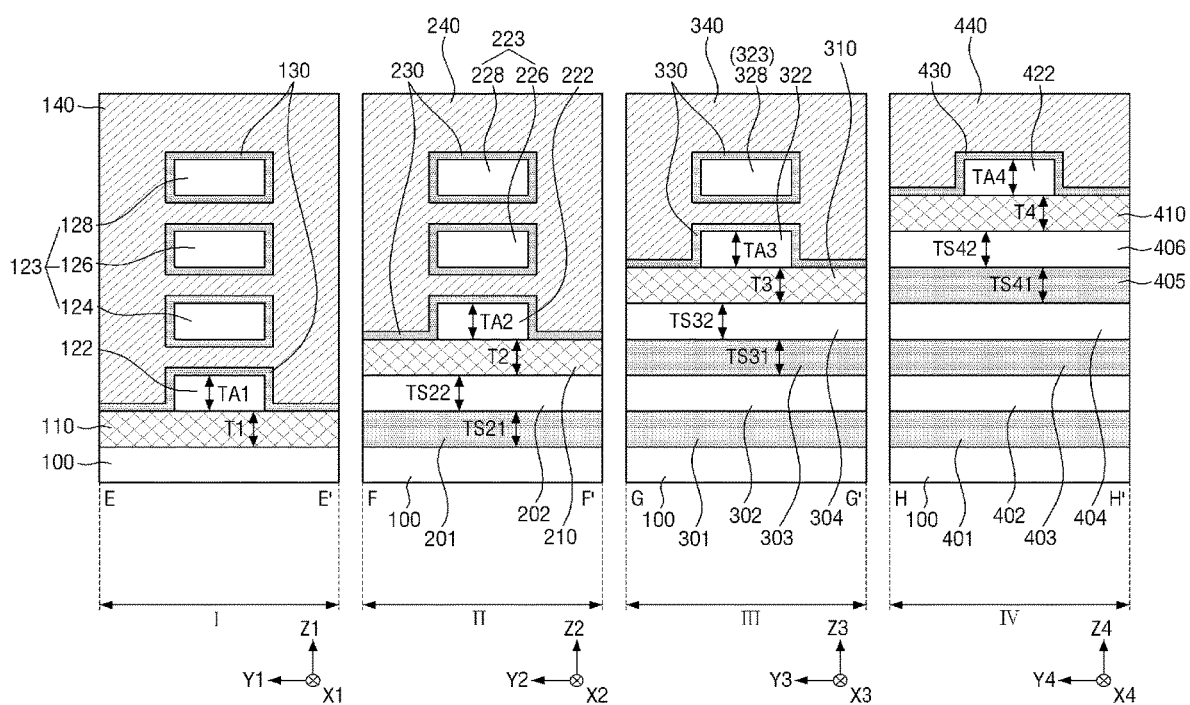
FIG. 12 is a cross-sectional view taken along lines E-E', F-F', G-G', and H-H' of FIG. 11.

FIG. 11 is a schematic plan view illustrating a semiconductor device according to some other embodiments. FIG. 12 is a cross-sectional view taken along lines E-E', F-F', G-G', and H-H' of FIG. 11. For simplicity of description, descriptions of features described previously with reference to FIGS. 2 and 3 will be omitted or described only briefly.

Referring to FIGS. 11 and 12, in the semiconductor device according to some other embodiments, the substrate 100 may include the first region I, the second region II, and a third region III, and a fourth region IV different from each other. The first region I, the second region II, the third region III and the fourth region IV may be, e.g., horizontally separate regions. Although it is illustrated in FIGS. 11 and 12 that the substrate 100 includes four regions for simplicity of description, the present disclosure is not limited thereto. For example, the semiconductor device according to some embodiments may include five or more regions.

One or more sacrificial layers 201, 301, 303, 401, 403, and 405, and one or more active layers 202, 302, 304, 402, 404, and 406 may be alternately stacked on the substrate 100. One or more sacrificial layers 201, 301, 303, 401, 403, and 405, and one or more active layers 202, 302, 304, 402, 404, and 406 may be stacked in third directions Z1, Z2, Z3, and Z4. Here, the third directions Z1, Z2, Z3, and Z4 may be the thickness direction of the substrate 100 and may be the same direction, e.g., but reflecting different respective regions on the substrate 100. For example, the first sacrificial layers 201, 301, and 401, the first active layers 202, 302, and 402, the second sacrificial layers 303 and 403, the second active layers 304 and 404, the third sacrificial layer 405, and the third active layer 406 may be sequentially stacked on the substrate 100.

The sacrificial layers 201, 301, 303, 401, and 403 in the respective regions I, II, III, and VI may be the sacrificial layers on the same level. For example, the first sacrificial layer 201 in the second region II, the first sacrificial layer 301 in the third region III, and the first sacrificial layer 401 in the fourth region VI may be the sacrificial layers on the same level. The second sacrificial layer 303 in the third region III and the second sacrificial layer 403 in the fourth region VI may be the sacrificial layers on the same level.

The active layers 202, 302, 304, 402, and 404 in the respective regions I, II, III, and VI may be the active layers on the same level. For example, the first active layer 202 in the second region II, the first active layer 302 in the third region III, and the first active layer 402 in the fourth region VI may be the active layers on the same level. The second active layer 304 in the third region III and the second active layer 404 in the fourth region VI may be the active layers on the same level. Here, the layers on the same level may mean the layers formed by the same manufacturing process.

In detail, the sacrificial layers 201, 301, 303, 401, 403, and 405, and the active layers 202, 302, 304, 402, 404, and 406 may have a stair shape. The first sacrificial layer 201 and the first active layer 202 may be formed in the second region II. In the third region III, the second sacrificial layer 303 and the second active layer 304 may be further formed in addition to the layers formed in the second region II. In the fourth region VI, the third sacrificial layer 403 and the third active layer 404 may be further formed in addition to the layers formed in the third region III.

The sacrificial layers 201, 301, 303, 401, 403, and 405, and the active layers 202, 302, 304, 402, 404, and 406 may contain different materials. For example, the sacrificial layers 201, 301, 303, 401, 403, and 405 may contain silicon, and the active layers 202, 302, 304, 402, 404, and 406 may contain silicon germanium.

The first to fourth regions I, II, III, and VI may include first to fourth isolation insulating layers 110, 210, 310, and 410, respectively. The first to fourth isolation insulating layers 110, 210, 310, and 410 may be arranged at different positions. For example, the first to fourth isolation insulating layers 110, 210, 310, and 410 may be arranged at different positions in the third directions Z1, Z2, Z3, and Z4. Here, the third directions Z1, Z2, Z3 and Z4 may be the same direction.

The first to fourth isolation insulating layers 110, 210, 310, and 410 may not overlap in the horizontal direction (e.g., second directions Y1, Y2, Y3, and Y4). Here, the second directions Y1, Y2, Y3, and Y4 may be the same direction, e.g., but reflecting different respective regions on the substrate 100. For example, the second isolation insulating layer 210 may be disposed above the first isolation insulating layer 110, the third isolation insulating layer 310 may be disposed above the second isolation insulating layer 210, and the fourth isolation insulating layer 410 may be disposed above the third isolation insulating layer 310. In other words, the top surface of the first isolation insulating layer 110, the top surface of the second isolation insulating layer 210, the top surface of the third isolation insulating layer 310, and the top surface of the fourth isolation insulating layer 410 may be arranged at different heights.

The number of the sacrificial layers 201, 301, 303, 401, 403, and 405, and the number of the active layers 202, 302, 304, 402, and 406 arranged under the respective first to fourth isolation insulating layers 110, 210, 310, and 410 may vary. Under the first isolation insulating layer 110, n sacrificial layers (n being a natural number) and n active layers may be disposed. Under the second isolation insulating layer 210, m sacrificial layers (m being a natural number) and m active layers may be disposed. In this case, n and m may be different from each other. In other words, the number of sacrificial layers disposed under the first isolation insulating layer 110 and the number of active layers disposed under the first isolation insulating layer 110 may be the same, but the number of sacrificial layers and the number of active layers disposed under the first isolation insulating layer 110 may be different from the number of sacrificial layers and the number of active layers disposed under the second isolation insulating layer 210.

For example, the first sacrificial layer 201 and the first active layer 202 may be sequentially stacked under the second isolation insulating layer 210. The first sacrificial layer 301, the first active layer 302, the second sacrificial layer 303, and the second active layer 304 may be sequentially stacked under the third isolation insulating layer 310. The first sacrificial layer 401, the first active layer 402, the second sacrificial layer 403, the second active layer 404, the third sacrificial layer 405, and the third active layer 406 may be sequentially stacked under the fourth isolation insulating layer 410.

The first isolation insulating layer 110 may be formed in the space from which the sacrificial layer in the first region I on the same level as the first sacrificial layer 201 in the second region II has been removed. Therefore, the thickness T1 of the first isolation insulating layer 110 may be substantially the same as a thickness TS21 of the first sacrificial layer 201 in the second region II.

The second isolation insulating layer 210 may be formed in the space from which the sacrificial layer in the second region II on the same level as the second sacrificial layer 303 in the third region III has been removed. Therefore, a thickness T2 of the second isolation insulating layer 210 may be substantially the same as a thickness TS31 of the second sacrificial layer 303 in the third region III.

The third isolation insulating layer 310 may be formed in the space from which the sacrificial layer in the third region III on the same level as the third sacrificial layer 405 in the fourth region VI has been removed. Therefore, a thickness T3 of the third isolation insulating layer 310 may be substantially the same as a thickness TS41 of the third sacrificial layer 405 in the fourth region VI. The fourth isolation insulating layer 410 may have a thickness T4.

The first lower active pattern 122 may be formed by patterning the active layer in the first region I on the same level as the first active layer 202 in the second region II. Therefore, the first lower active pattern 122 may be formed on the same level as the first active layer 202 in the second region II. The thickness TA1 of the first lower active pattern 122 is substantially the same as a thickness TS22 of the first active layer 202 in the second region II.

The second lower active pattern 222 may be formed by patterning the active layer in the second region II on the same level as the second active layer 304 in the third region III. Therefore, the second lower active pattern 222 may be formed on the same level as the second active layer 304 in the third region III. The thickness TA2 of the second lower active pattern 222 may be substantially the same as a thickness TS32 of the second active layer 304 in the third region III.

The third lower active pattern 322 may be formed by patterning the active layer in the third region III on the same level as the third active layer 406 in the fourth region VI. Therefore, the third lower active pattern 322 may be formed on the same level as the third active layer 406 in the fourth region VI. The thickness TA3 of the third lower active pattern 322 may be substantially the same as a thickness TS42 of the third active layer 406 in the fourth region VI.

Meanwhile, the first gate electrode 140 may surround the first active patterns 122 and 123, the second gate electrode 240 may surround the second active patterns 222 and 223, the third gate electrode 340 may surround the third active patterns 322 and 323, and the fourth gate electrode 440 may surround a fourth active pattern 422. The fourth active pattern 422 may have a thickness TA4.

The number of the first active patterns 122 and 123 arranged on the first region I, the number of the second active patterns 222 and 223 arranged on the second region II, the number of the third active patterns 322 and 323 arranged on the third region III, and the number of the fourth active pattern 422 arranged on the fourth region VI may be different from each other. In other words, the area of the first active patterns 122 and 123 surrounded by the first gate electrode 140, the area of the second active patterns 222 and 223 surrounded by the second gate electrode 240, the area of the third active patterns 322 and 323 surrounded by the third gate electrode 340, and the area of the fourth active pattern 422 surrounded by the fourth gate electrode 440 may be different from each other. Accordingly, the driving performance of the elements formed in the first to fourth regions I, II, III, and VI of the semiconductor device according to some embodiments may be different. Although it is illustrated in FIGS. 11 and 12 that the number of the first active patterns 122 and 123 arranged on the first region I is four for simplicity of description, the present disclosure is not limited thereto. For example, five or more first active patterns 122 and 123 may be arranged on the first region I. Accordingly, the number of the active patterns arranged on the second to fourth regions II, III, and VI may also be increased.

The driving performance of the semiconductor device may vary depending on the contact area between the gate electrode and the active patterns. At this time, the size of the semiconductor device may be increased to increase the contact area between the gate electrode and the active patterns.

However, in the semiconductor device according to some embodiments, the contact area between the gate electrode and the active pattern may be increased or decreased by adjusting the position where the active patterns are formed. In other words, the contact area between the gate electrode and the active patterns may be increased without increasing the area of the semiconductor device.

Figure 13:
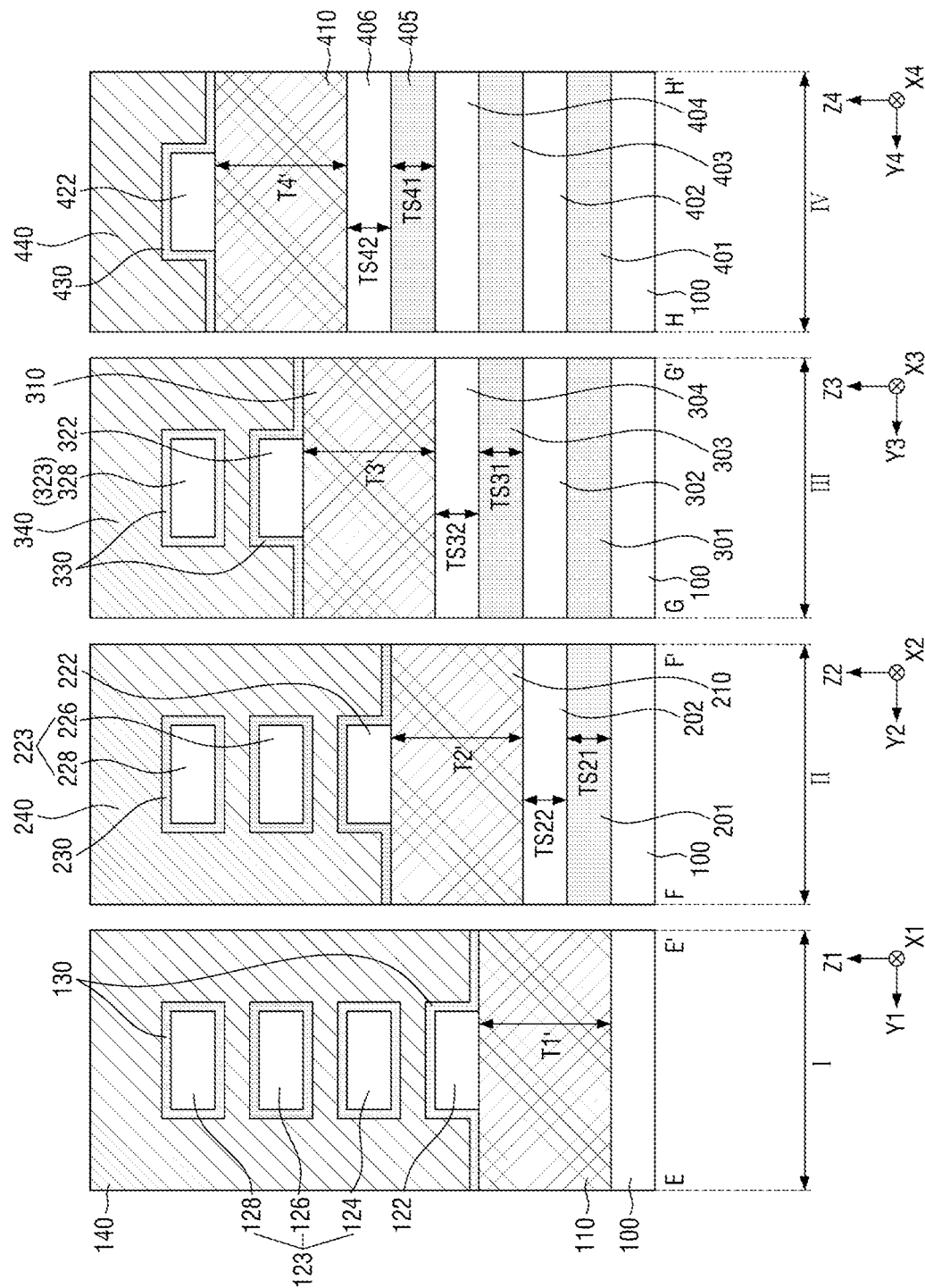
FIG. 13 is a cross-sectional view taken along lines E-E', F-F', G-G', and H-H' of FIG. 11 , according to some embodiments.

FIG. 13 is a cross-sectional view taken along lines E-E', F-F', G-G', and H-H' of FIG. 11. For simplicity of description, descriptions of features described previously with reference to FIGS. 11 and 12 will be omitted or described only briefly.

Referring to FIGS. 11 and 13, in the semiconductor device according to some other embodiments, the first to fourth isolation insulating layers 110, 210, 310, and 410 may be arranged at different positions in, e.g., the third directions Z1, Z2, Z3, and Z4. Here, the third directions Z1, Z2, Z3, and Z4 may be the same direction.

The first to fourth isolation insulating layers 110, 210, 310, and 410 may at least partially overlap each other in the horizontal direction (e.g., the second directions Y1, Y2, Y3, and Y4). Here, the second directions Y1, Y2, Y3, and Y4 may be the same direction. For example, at least a part of the second isolation insulating layer 210 may overlap the first isolation insulating layer 110, at least a part of the third isolation insulating layer 310 may overlap the second isolation insulating layer 210, and at least a part of the fourth isolation insulating layer 410 may overlap the third isolation insulating layer 310.

The first isolation insulating layer 110 may be formed in the space from which the sacrificial layer and the active layer on the same level as the first sacrificial layer 201 in the second region II, the first active layer 202 in the second region II, and the second sacrificial layer 303 in the third region III have been removed. Therefore, the thickness T1' of the first isolation insulating layer 110 may be greater than the thickness TS21 of the first sacrificial layer 201 in the second region II and the thickness TS22 of the first active layer 202 in the second region II. Further, the thickness T1' of the first isolation insulating layer 110 may be substantially the same as the sum of the thickness TS21 of the first sacrificial layer 201 in the second region II, the thickness TS22 of the first active layer 202 in the second region II, and the thickness TS31 of the second sacrificial layer 303 in the third region III.

The second isolation insulating layer 210 may be formed in the space from which the sacrificial layer and the active layer on the same level as the second sacrificial layer 303 in the third region III, the second active layer 304 in the third region III, and the third sacrificial layer 405 in the fourth region VI have been removed. Therefore, the thickness T2' of the second isolation insulating layer 210 may be greater than the thickness TS31 of the second sacrificial layer 303 in the third region III, and the thickness TS32 of the second active layer 304 in the third region III. Further, the thickness T2' of the second isolation insulating layer 210 may be substantially the same as the sum of the thickness TS31 of the second sacrificial layer 303 in the third region III, the thickness TS32 of the second active layer 304 in the third region III, and the thickness TS41 of the third sacrificial layer 405 in the fourth region VI.

The thickness T3' of the third isolation insulating layer 310 may be greater than the thickness TS41 of the third sacrificial layer 405 in the fourth region VI and the thickness TS42 of the third active layer 406 in the fourth region VI. The fourth isolation insulating layer 410 may have a thickness T4'.

FIGS. 14 to 32 are views illustrating, e.g., sequential, stages in a method for fabricating a semiconductor device according to some embodiments. For reference, FIGS. 15, 17, 19, 21, 23, 25, 27, 29, and 31 are cross-sectional views taken along line A-A' of FIG. 14. FIGS. 16, 18, 20, 22, 24, 26, 30, and 32 are cross-sectional views taken along line B-B' of FIG. 14.

Figure 14:
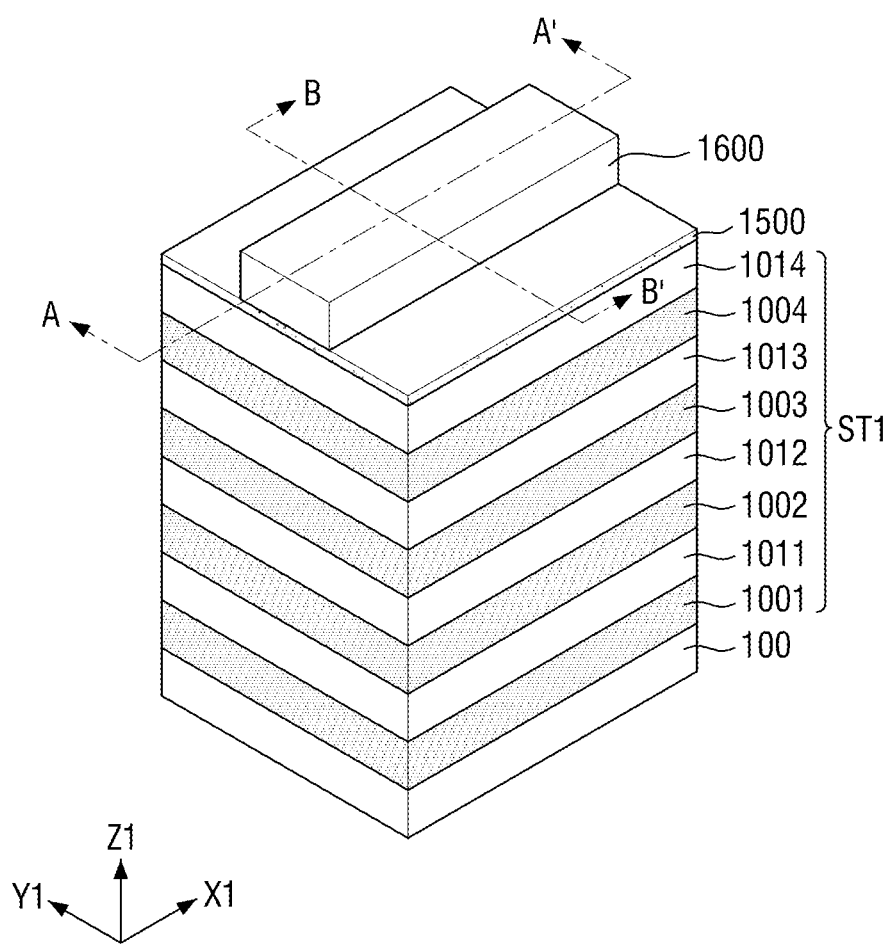
FIGS. 14 to 32 are views illustrating stages in a method for fabricating a semiconductor device according to some embodiments.
Figure 15:
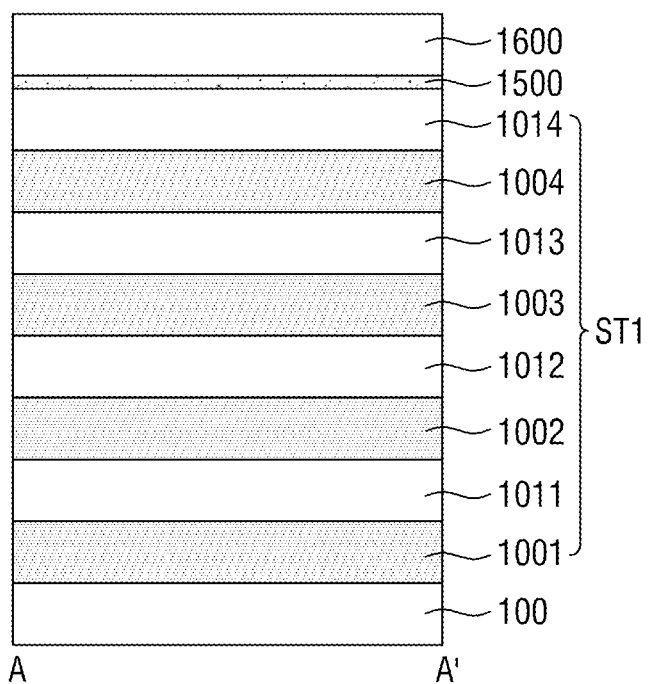
Figure 16:
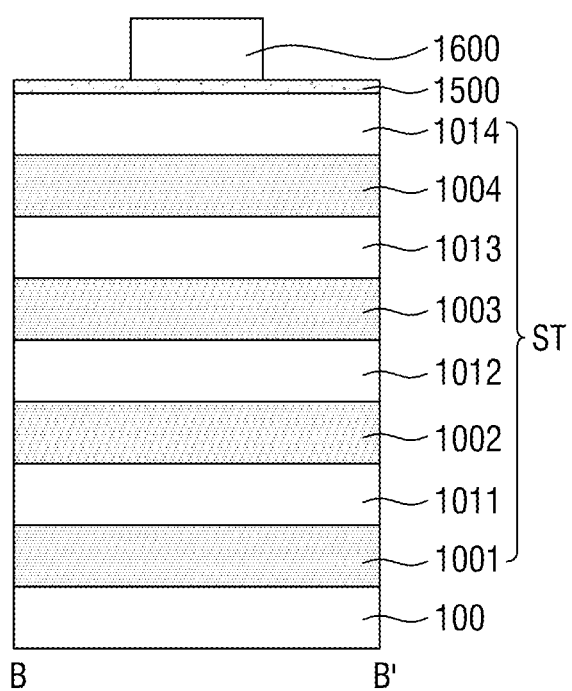

Referring to FIGS. 14 to 16, a laminate structure ST1 in which sacrificial layers 1001, 1002, 1003, and 1004 and active layers 1011, 1012, 1013, and 1014 are alternately stacked may be formed on the substrate 100.

The active layers 1011, 1012, 1013, and 1014 may contain a material having an etching selectivity with respect to the sacrificial layers 1001, 1002, 1003, and 1004. The sacrificial layers 1001, 1002, 1003, and 1004 and the active layers 1011, 1012, 1013, and 1014 may be formed by, e.g., an epitaxial growth method. For example, the sacrificial layers 1001, 1002, 1003, and 1004 may contain silicon germanium, and the active layers 1011, 1012, 1013, and 1014 may contain silicon.

Although the four active layers 1011, 1012, 1013, and 1014 and the four sacrificial layers 1001, 1002, 1003, and 1004 are illustrated in FIGS. 14 to 16 for simplicity of description, the present disclosure is not limited thereto. Further, although it is illustrated that the active layer 1014 is disposed at the uppermost portion of the laminate structure ST1 for simplicity of description, the present disclosure is not limited thereto. For example, a sacrificial layer may be disposed at the uppermost portion of the laminate structure ST1.

Then, a buffer layer 1500 may be formed on the laminate structure ST1. The buffer layer 1500 may contain, e.g., silicon oxide.

Then, a first mask pattern 1600 may be formed on the buffer layer 1500. The first mask pattern 1600 may be elongated in the first direction X1.

Figure 17:
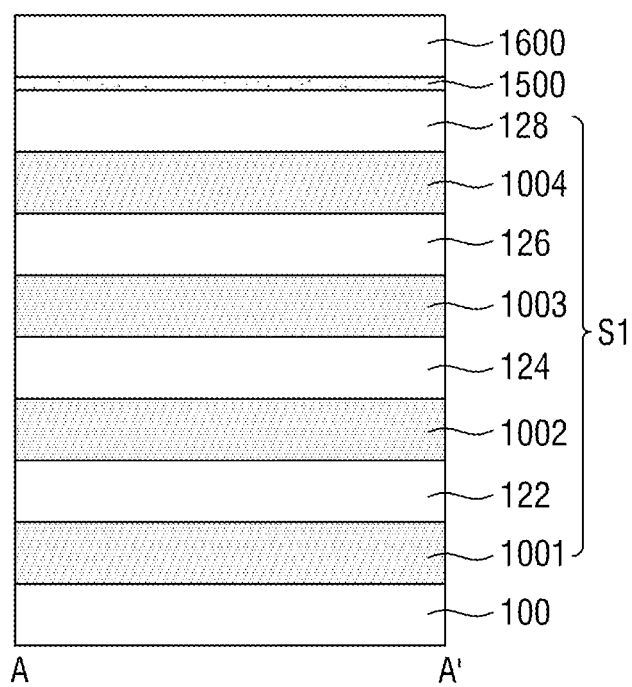
Figure 18:
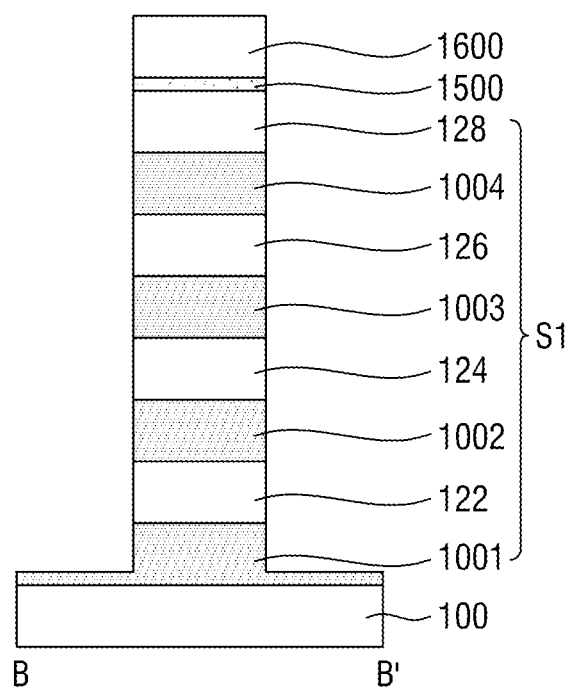

Referring to FIGS. 17 and 18, an etching process may be performed using the first mask pattern 1600 as an etching mask. The laminate structure ST1 may be etched to form a stacked structure S1.

At this time, the etching process may be performed from the top surface to the laminate structure ST1 to at least a part of the first sacrificial layer 1001 disposed at the lowermost portion. In other words, at least a part of the top surface of the first sacrificial layer 1001 may be exposed by the etching process. For example, as illustrated in FIG. 18, a first portion of the first sacrificial layer 1001 may be at the bottom of the stacked structure S1 to overlap the bottoms of the layers of the stacked structure S1, while a second portion of the first sacrificial layer 1001 may be adjacent to the first portion but not overlapping the bottom of stacked structure S1, e.g., a thickness of the second portion of the first sacrificial layer 1001 may be less than a thickness of the first portion of the first sacrificial layer 1001 relative to the substrate 100. Further, the first to fourth active layers 1011, 1012, 1013, and 1014 may be etched to form first to fourth active patterns 122, 124, 126, and 128 extending in the first direction X1.

Accordingly, the stacked structure S1 protruding from the first sacrificial layer 1001 in the third direction Z1 may be formed. The stacked structure S1 may include a part of the first sacrificial layer 1001, and the first to fourth sacrificial layers 1001, 1002, 1003, and 1004, and the first to fourth active patterns 122, 124, 126, and 128.

Figure 19:
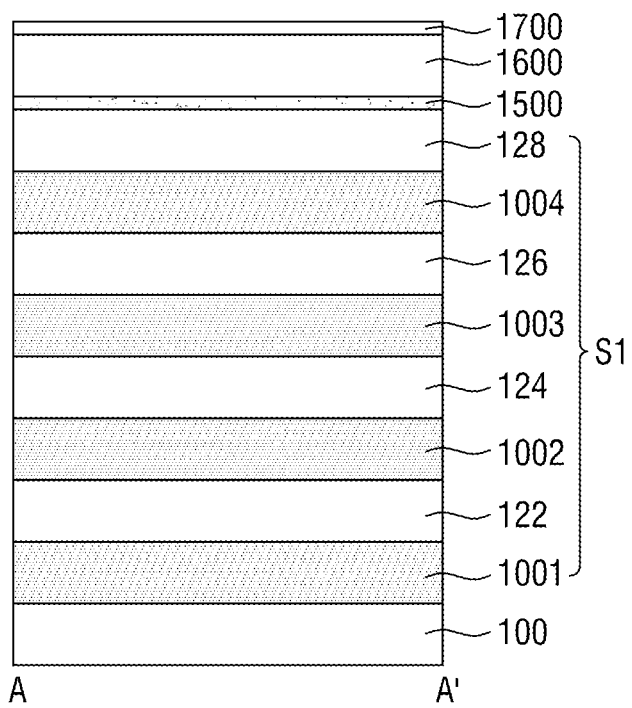
Figure 20:
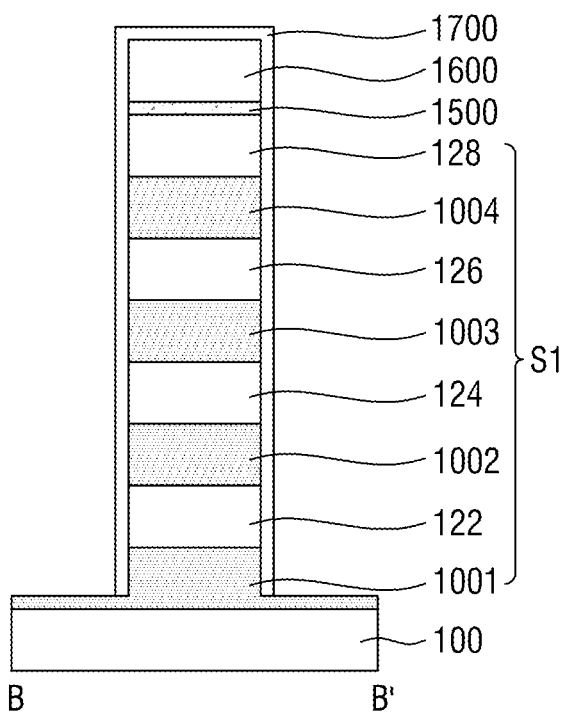

Referring to FIGS. 19 and 20, a liner layer 1700 may be formed. The liner layer 1700 may be formed to be conformal on the top surface and the side surface of the first mask pattern 1600, the side surface of the stacked structure S1, and the exposed top surface of the first sacrificial layer 1001. Then, a part of the liner layer 1700 formed on the top surface of the first sacrificial layer 1001 exposed by the stacked structure S1 may be removed by isotropic etching, e.g., a part of the liner layer 1700 may be removed from the second portion of the first sacrificial layer 1001 that does not overlap the bottom of the stacked structure S1. Accordingly, the liner layer 1700 may surround the top surface and the side surface of the first mask pattern 1600 and the side surface of the stacked structure S1.

The liner layer 1700 may contain, e.g., the same material as the material contained in the first mask pattern 1600. The liner layer 1700 may include, e.g., silicon nitride, but is not limited thereto.

Figure 21:
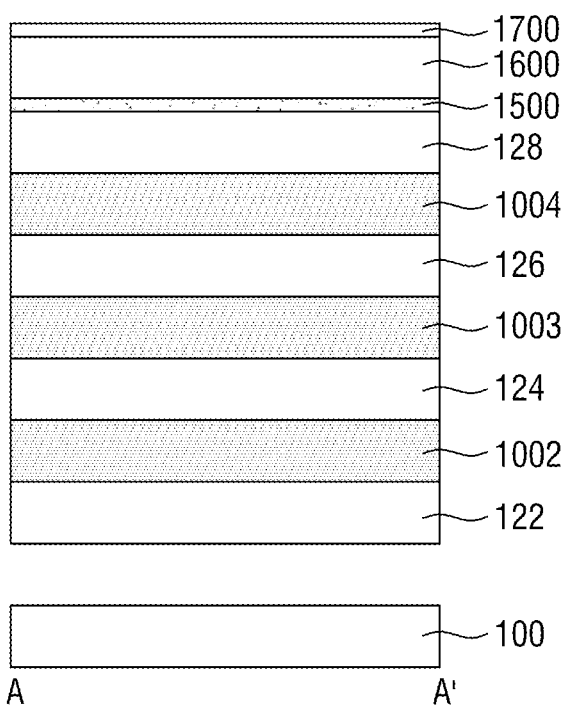
Figure 22:
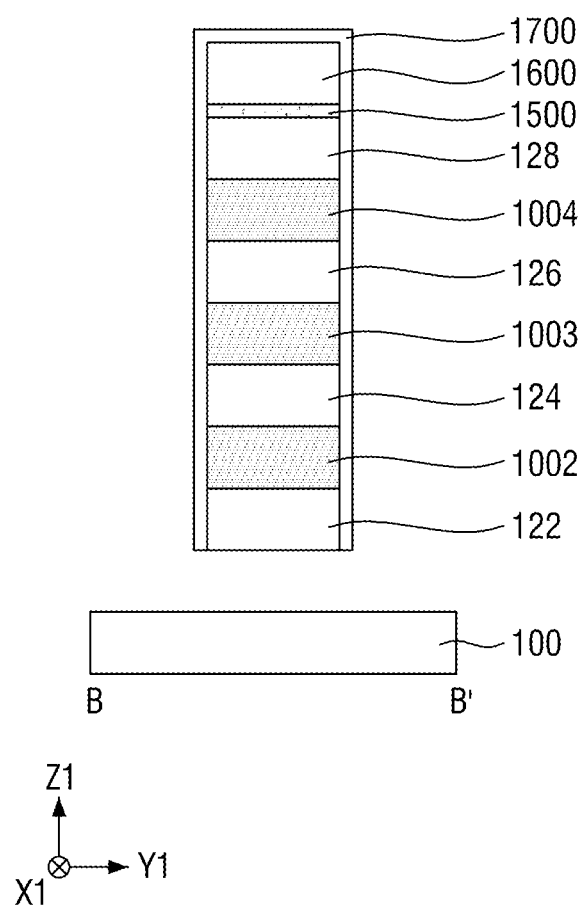

Referring to FIGS. 21 and 22, the first sacrificial layer 1001 exposed by the liner layer 1700 may be removed. For example, as illustrated in FIG. 21, the first sacrificial layer 1001 may be completely removed through the second portion of the first sacrificial layer 1001 that is exposed by the liner layer 1700, e.g., including the first portion of the first sacrificial layer 1001 between the substrate 100 and the active pattern 122.

Figure 23:
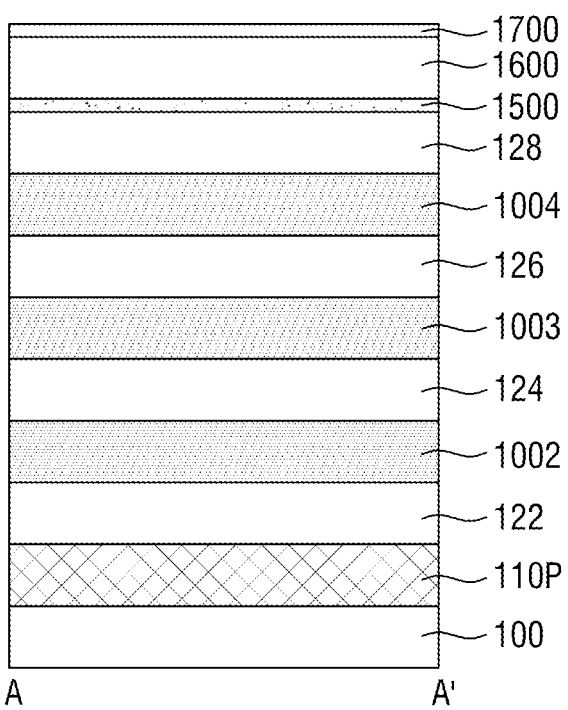
Figure 24:
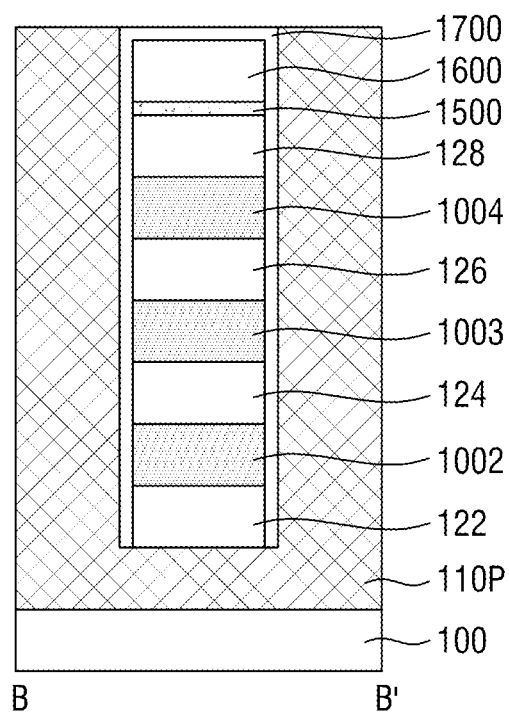

Referring to FIGS. 23 and 24, a pre-isolation insulating layer 110P may be formed on the substrate 100. For example, as illustrated in FIG. 24, the pre-isolation insulating layer 110P may be formed on the substrate 100 and along the sides and bottom of the stacked structure, e.g., including in the space between the substrate 100 and the active pattern 122. Accordingly, the space from which the first sacrificial layer 1001 has been removed can be filled with the pre-isolation insulating layer 110P.

Figure 25:
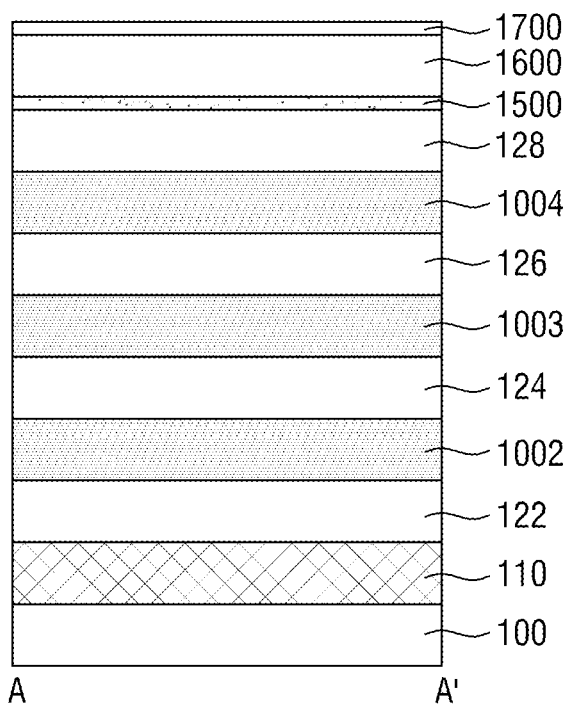
Figure 26:
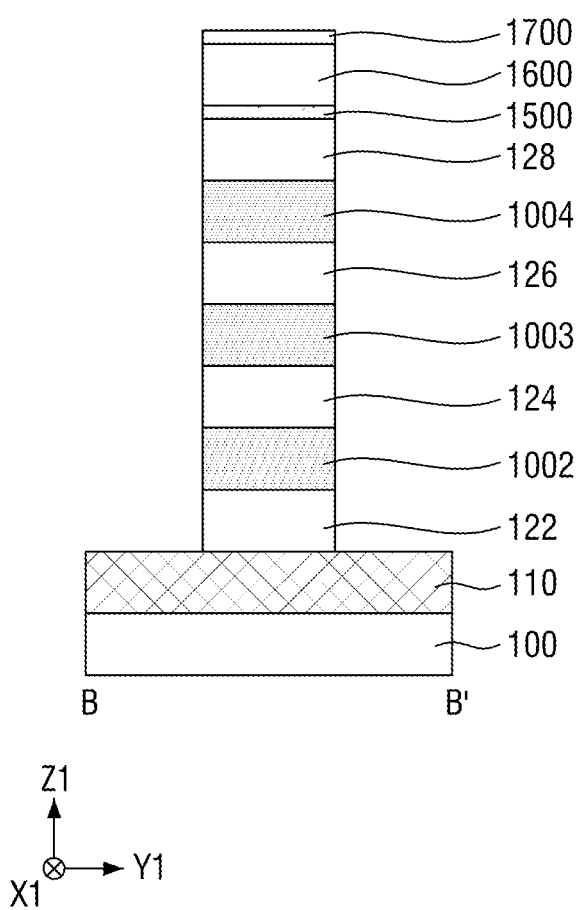

Referring to FIGS. 25 and 26, an etching process may be performed using, as an etching mask, the liner layer 1700 disposed on the top surface of the first mask pattern 1600. Accordingly, the side surfaces of the active patterns 122, 124, 126, and 128 and the side surfaces of the sacrificial layers 1002, 1003, and 1004 may be exposed.

Further, the isolation insulating layer 110 may be formed in the space from which the first sacrificial layer 1001 has been removed. That is, a portion of the pre-isolation insulating layer 110P between the substrate 100 and the active pattern 122 may become the isolation insulating layer 110.

Figure 27:
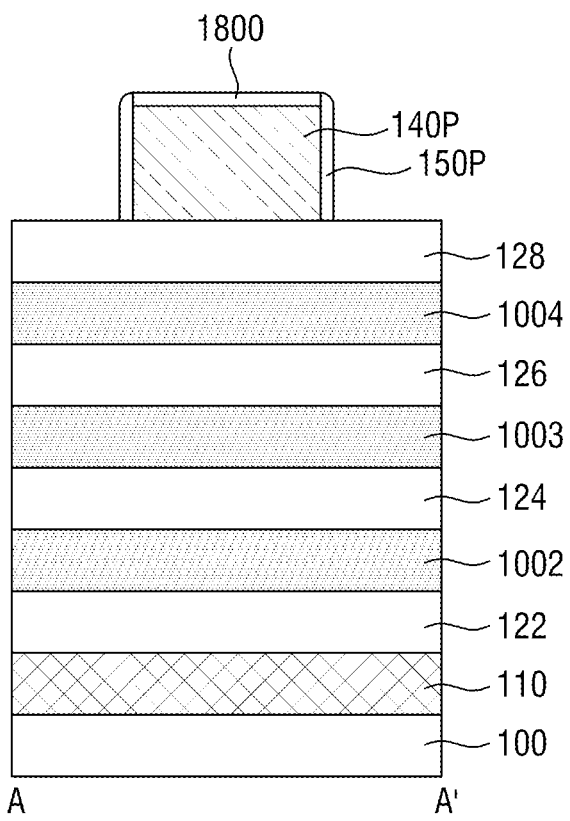
Figure 28:
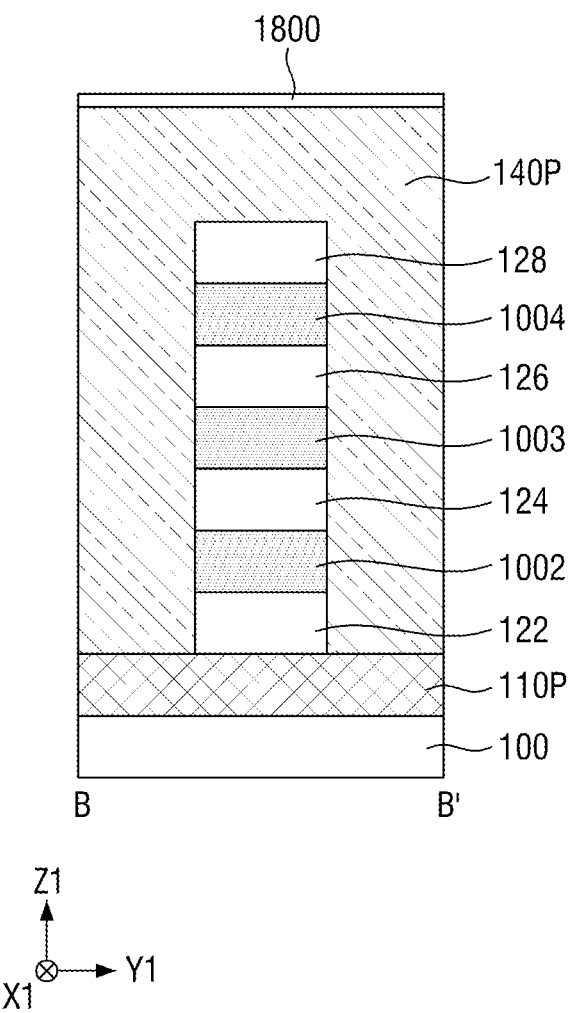

Referring to FIGS. 27 and 28, the liner layer 1700, the first mask pattern 1600, and the buffer layer 1500 may be removed. Then, a dummy gate electrode 140P extending in the second direction Y1 may be formed on the fourth active pattern 128.

The dummy gate electrode 140P may be formed using a second mask pattern 1800 as an etching mask. A dummy gate dielectric layer or a protective layer may be further formed between the dummy gate electrode 140P and the fourth active pattern 128. In addition, a pre-gate spacer 150P may be formed on the sidewall of the dummy gate electrode 140P.

Figure 29:
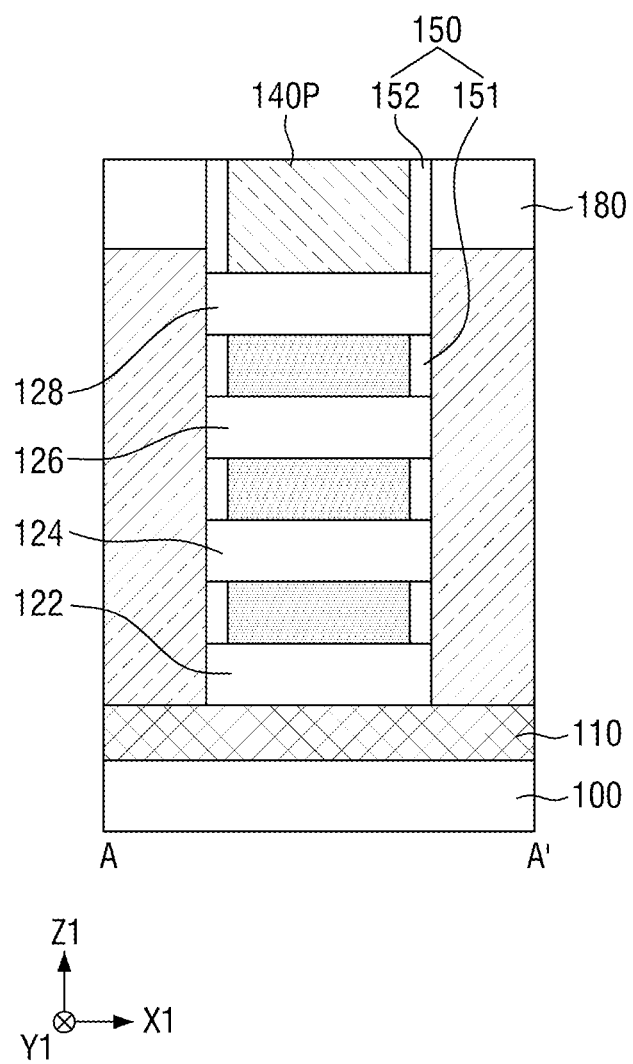
Figure 30:
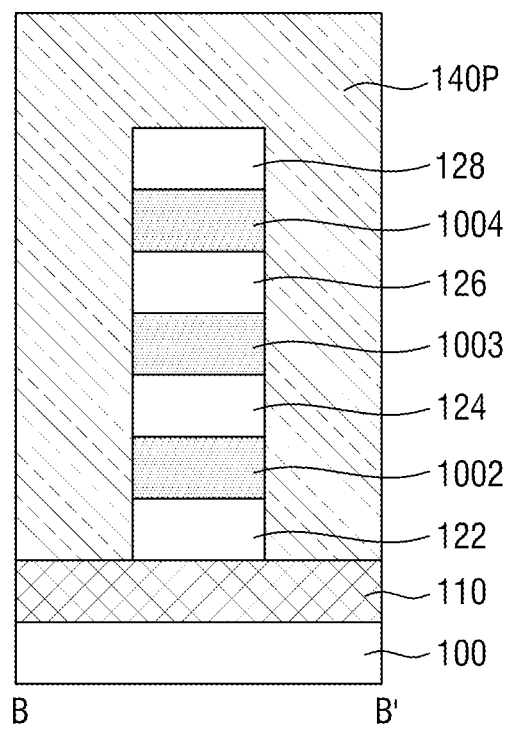
Figure 30:
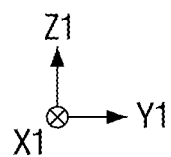

Referring to FIGS. 29 and 30, the first source/drain region 160 may be formed on both sides of the dummy gate electrode 140P. In some embodiments, the sacrificial layers 1002, 1003, and 1004 and the active patterns 122, 124, 126, and 128 may be partially removed to form the first source/drain region 160.

After the sacrificial layers 1002, 1003, and 1004 and the active patterns 122, 124, 126, and 128 are partially removed, at least a part of the sacrificial layers 1002, 1003, and 1004 overlapping the pre-gate spacer 150P may be further removed. The first inner spacers 151 may be formed at the positions where the sacrificial layers 1002, 1003, and 1004 are further removed. Then, the first source/drain region 160 may be formed on both sides of the dummy gate electrode 140P.

Then, an interlayer insulating layer 180 covering the first source/drain region 160 may be formed on the isolation insulating layer 110. The dummy gate electrode 140P may be exposed by the interlayer insulating layer 180.

The second mask pattern 1800 may be removed during the formation of the interlayer insulating layer 180. Further, the first outer spacer 152 may be formed on the first inner spacer 151 during the formation of the interlayer insulating layer 180. Accordingly, the gate spacer 150 including the inner spacers 151 and the outer spacer 152 may be formed.

Figure 31:
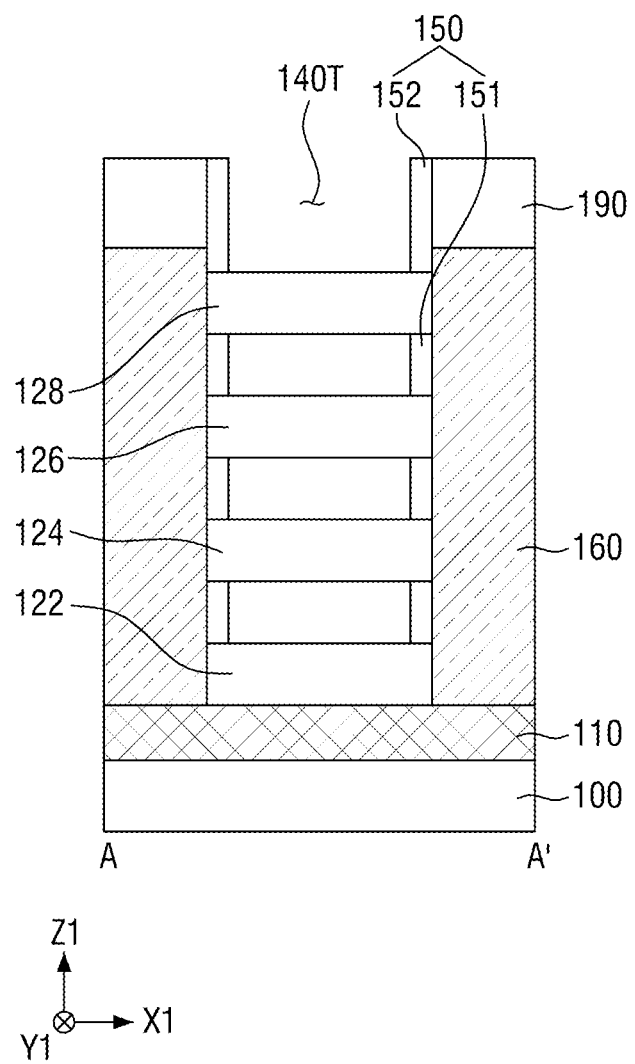
Figure 32:
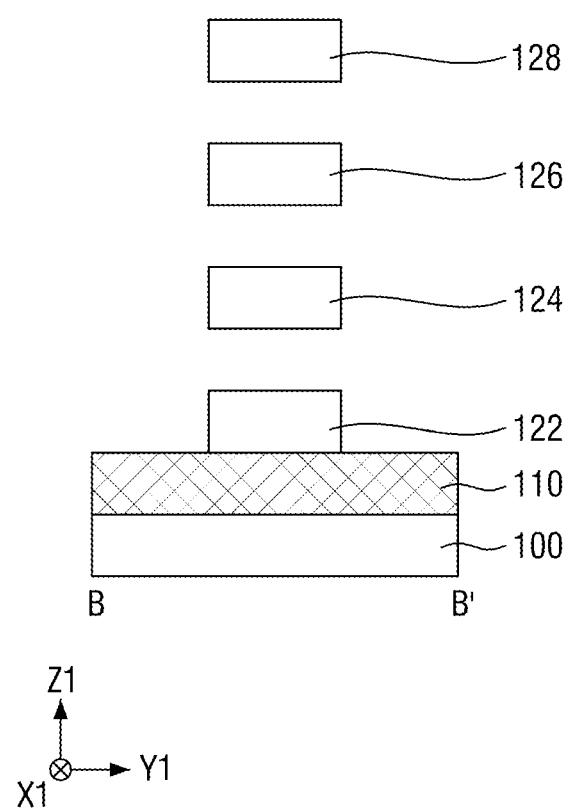

Referring to FIGS. 31 and 32, the dummy gate electrode 140P and the sacrificial layers 1002, 1003, and 1004 may be removed. Accordingly, a trench 140T elongated in the second direction Y1 may be formed. Further, the first active patterns 122, 124, 126, and 128 may be exposed.

The first lower active pattern 122 may be formed on the isolation insulating layer 110. The first sub-active pattern 124 may be spaced apart from the first lower active pattern 122, the second sub-active pattern 126 may be spaced apart from the first sub-active pattern 124, and the third sub-active pattern 128 may be spaced apart from the second sub-active pattern 126.

Next, referring to FIGS. 2 and 3, the first gate dielectric layer 130 and the first gate electrode 140 may be formed in the trench 140T. Although the first gate electrode 140 that is a single layer is illustrated for simplicity of description, the technical spirit of the present disclosure is not limited thereto. For example, the first gate electrode 140 may be a multiple layer. For example, the first gate electrode 140 may include a work function adjusting layer to adjust the work function and a filling conductive layer to fill a space formed by the work function adjusting layer. In other words, the semiconductor device according to some embodiments uses a bulk silicon substrate, rather than an SOI substrate, so that it is possible to form the semiconductor device including the first isolation insulating layer 110 on the substrate 100.

Figure 33:
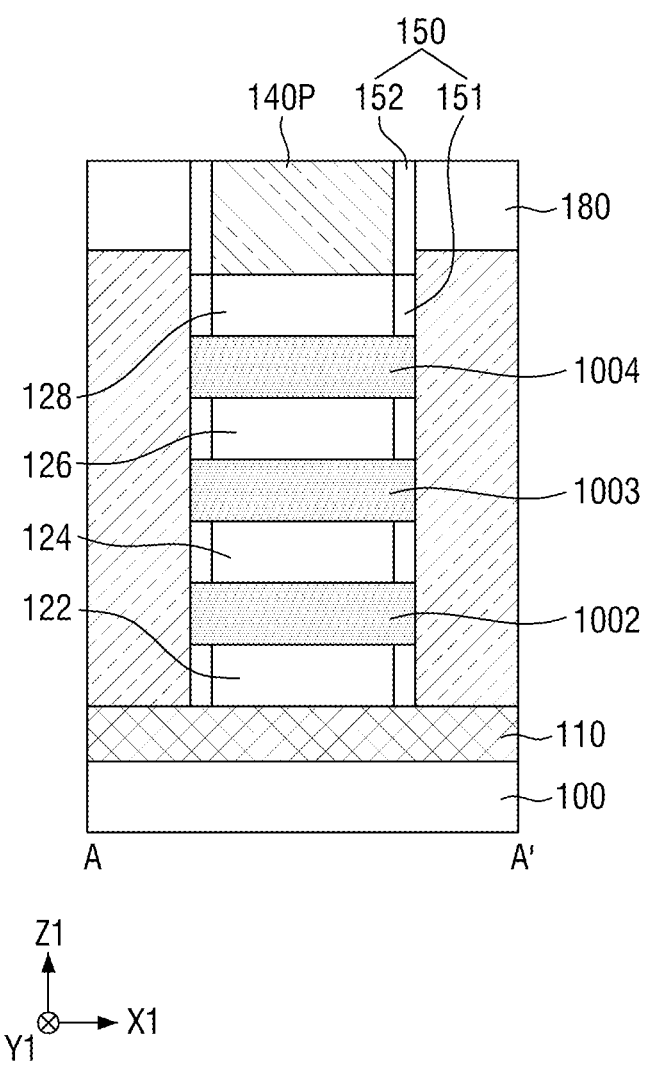
FIGS. 33 to 36 are views illustrating stages in a method for fabricating a semiconductor device according to some embodiments.
Figure 34:
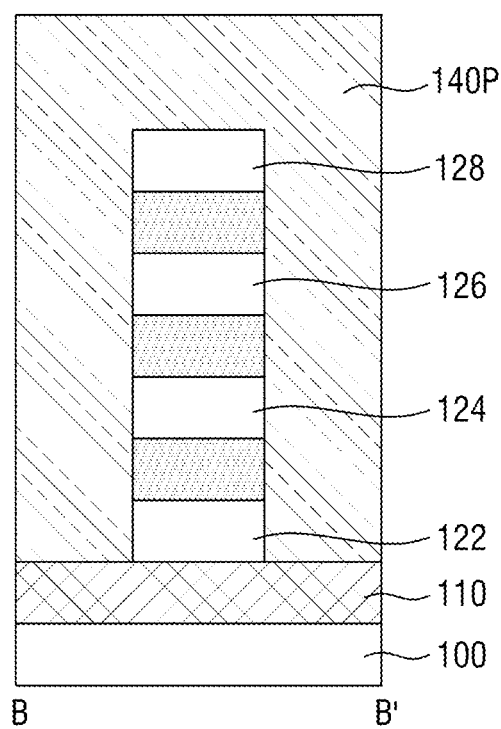
Figure 35:
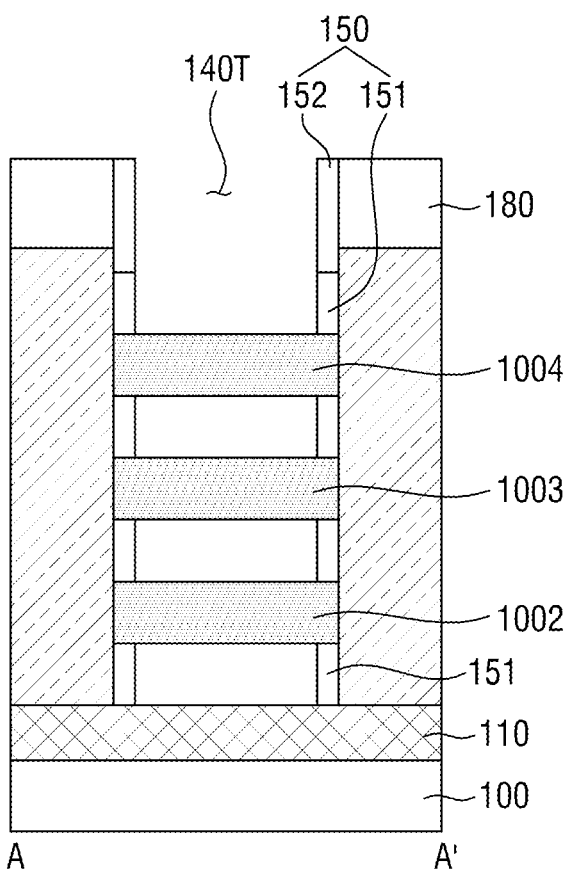
Figure 36:
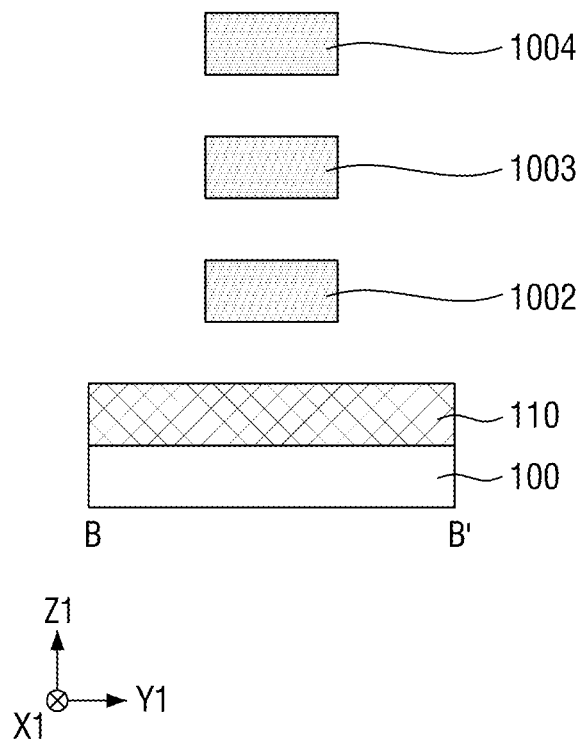

FIGS. 33 to 36 are views illustrating stages in a method for fabricating a semiconductor device according to some embodiments. For reference, FIGS. 33 and 35 are cross-sectional views taken along line A-A' of FIG. 14. FIGS. 34 and 36 are cross-sectional views taken along line B-B' of FIG. 14. FIG. 33 is a view subsequent to FIG. 27 and FIG. 34 is a view subsequent to FIG. 28.

Referring to FIGS. 33 and 34, the first source/drain region 160 may be formed on both sides of the dummy gate electrode 140P. In some embodiments, the sacrificial layers 1002, 1003, and 1004 and the active patterns 122, 124, 126, and 128 may be partially removed to form the first source/drain region 160.

After the sacrificial layers 1002, 1003, and 1004 and the active patterns 122, 124, 126, and 128 are partially removed, at least a part of the active pattern 122, 124, 126, and 128 overlapping the pre-gate spacer 150P may be further removed. The first inner spacers 151 may be formed at the positions where the active pattern 122, 124, 126, and 128 are further removed. Then, the first source/drain region 160 may be formed on both sides of the dummy gate electrode 140P.

Then, the interlayer insulating layer 180 covering the first source/drain region 160 may be formed on the isolation insulating layer 110. The dummy gate electrode 140P may be exposed by the interlayer insulating layer 180.

The second mask pattern 1800 may be removed during the formation of the interlayer insulating layer 180. Further, the first outer spacer 152 may be formed on the first inner spacer 151 during the formation of the interlayer insulating layer 180. Accordingly, the gate spacer 150 including the inner spacers 151 and the outer spacer 152 may be formed. Further, the outer spacer 152 may be formed on the inner spacer 151.

Referring to FIGS. 35 and 36, the dummy gate electrode 140P and the active patterns 122, 124, 126, and 128 may be removed. Accordingly, the trench 140T elongated in the second direction Y1 may be formed. Further, the sacrificial layers 1002, 1003, and 1004 may be exposed. The second to fourth sacrificial layers 1002, 1003, and 1004 may be spaced apart from each other. In other words, the second to fourth sacrificial layers 1002, 1003, and 1004 may be used as active patterns.

Next, referring to FIGS. 4 and 5, the second to fourth sacrificial layers 1002, 1003, and 1004 may correspond to the first active patterns 124, 126, and 128 of FIGS. 4 and 5. The first gate dielectric layer 130 and the first gate electrode 140 may be formed in the trench 140T.

Figure 37:
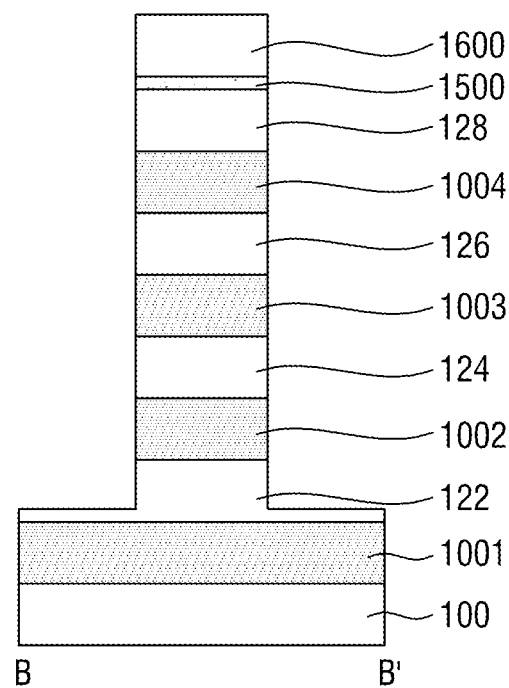
FIGS. 37 to 40 are views illustrating stages in a method for fabricating a semiconductor device according to some embodiments.

FIGS. 37 to 40 are views illustrating stages in a method for fabricating a semiconductor device according to some embodiments. For reference, FIGS. 37 to 40 are cross-sectional views taken along line B-B' of FIG. 14. FIG. 37 is a view subsequent to FIG. 16.

Referring to FIG. 37, an etching process may be performed using the first mask pattern 1600 as an etching mask. At this time, the etching process may be performed from the top surface of the laminate structure to at least a part of the first active layer 1011 disposed at the lowermost portion. In other words, at least a part of the top surface of the first active layer 1011 may be exposed by the etching process. Further, the second to fourth active layers 1012, 1013, and 1014 may be etched to form the second to fourth active patterns 124, 126, and 128 extending in the first direction X1.

Accordingly, a stacked structure protruding from the first active pattern 122 in the third direction Z1 may be formed. The stacked structure may be formed on the first sacrificial layer 1001, and may include the first to fourth active patterns 122, 124, 126, and 128 and the second to fourth sacrificial layers 1002, 1003, and 1004.

In other words, in the method for fabricating a semiconductor device according to some other embodiments, the position of the stopper of the etching process may be set in consideration of an etching material and/or an etching time. Accordingly, a sacrificial layer or an active layer at a desired position may be set as the stopper of the etching process, and the top surface thereof may be exposed. Therefore, the number of active patterns included in the semiconductor device may be adjusted.

Figure 38:
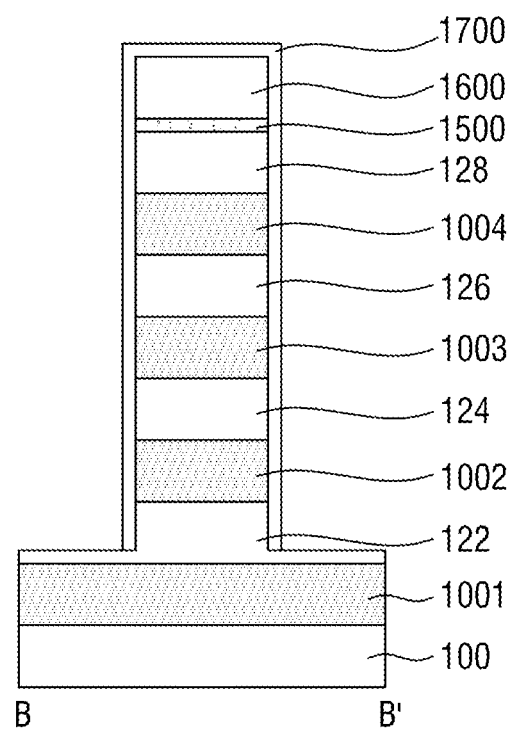

Referring to FIG. 38, a liner layer 1700 may be formed. The liner layer 1700 may be formed to be conformal to the top surface and the side surface of the first mask pattern 1600, the side surface of the stacked structure, and the exposed top surface of the first active pattern 122. Then, a part of the liner layer 1700 formed on the top surface of the first active pattern 122 exposed by the stacked structure may be removed by isotropic etching. Accordingly, the liner layer 1700 may surround the top surface and the side surface of the first mask pattern 1600, and the side surface of the stacked structure.

Figure 39:
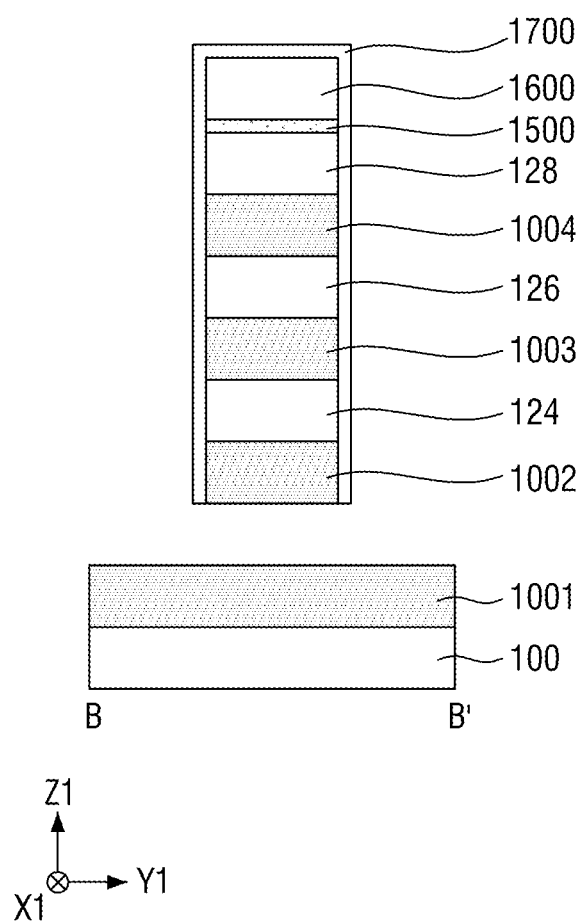

Referring to FIG. 39, the first active pattern 122 exposed by the liner layer 1700 may be removed.

Figure 40:
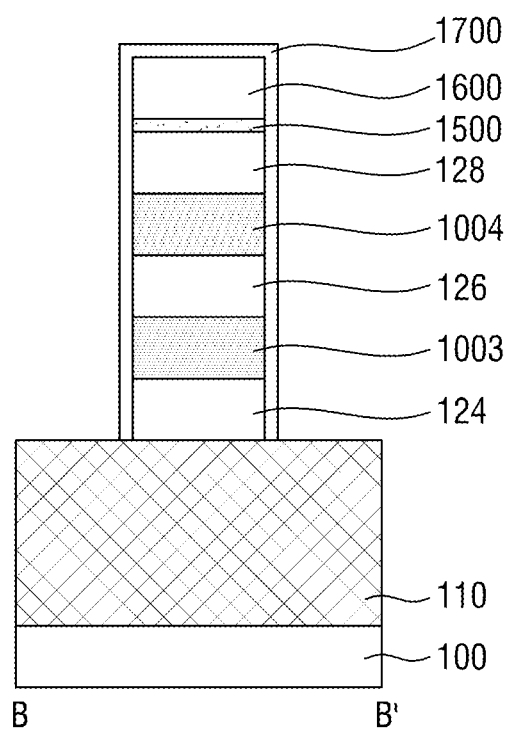
Figure 40:
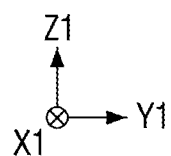

Referring to FIG. 40, the first sacrificial layer 1001 and the second sacrificial layer 1002 exposed by the removal of the first active pattern 122 may be removed. Then, the first isolation insulating layer 110 may be formed in the space from which the first sacrificial layer 1001, the first active pattern 122, and the second sacrificial layer 1002 have been removed.

Next, referring to FIGS. 23 to 31 and FIGS. 6 to 7, the first gate dielectric layer 130 and the first gate electrode 140 may be formed.

In the method for fabricating a semiconductor device according to some other embodiments, the first active pattern 122, the first sacrificial layer 1001, and the second sacrificial layer 1002 may be removed to form the first isolation insulating layer 110.

Figure 41:
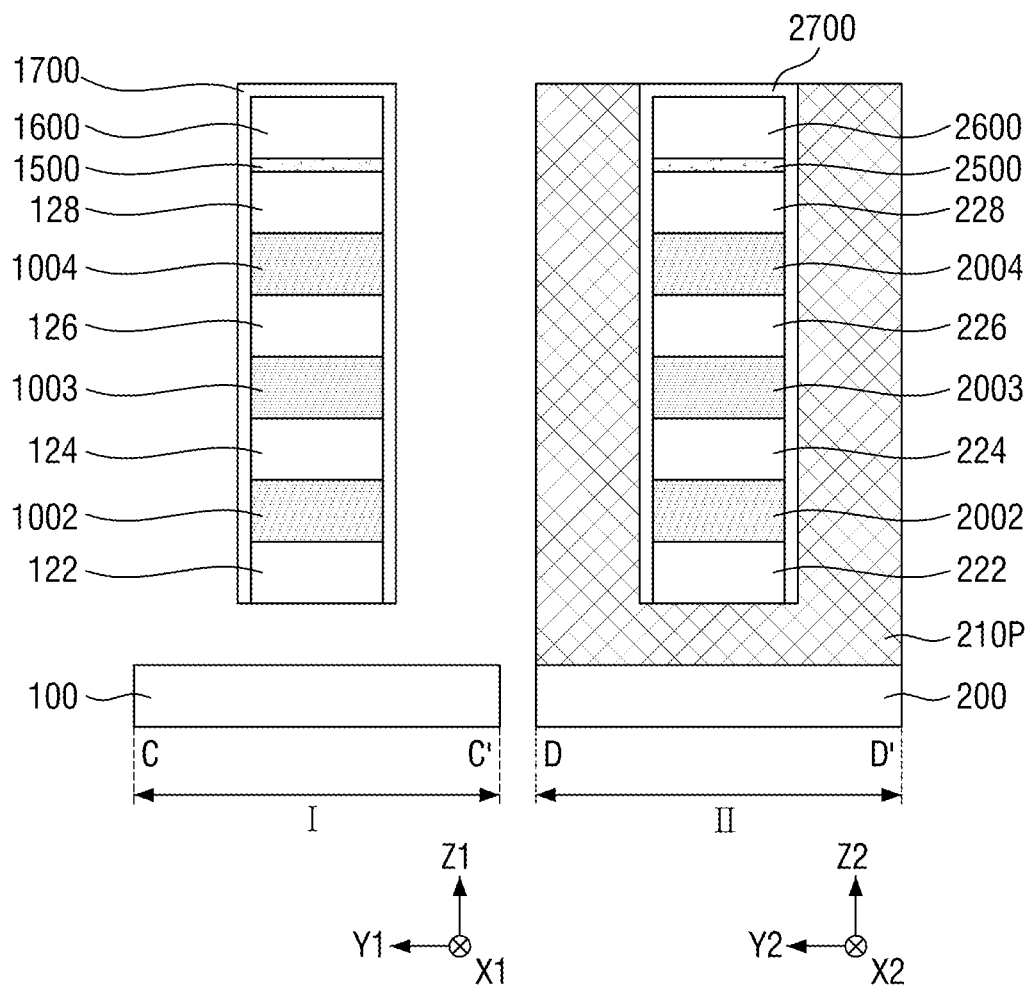
FIGS. 41 and 42 are views illustrating stages in a method for fabricating a semiconductor device according to some embodiments.
Figure 42:
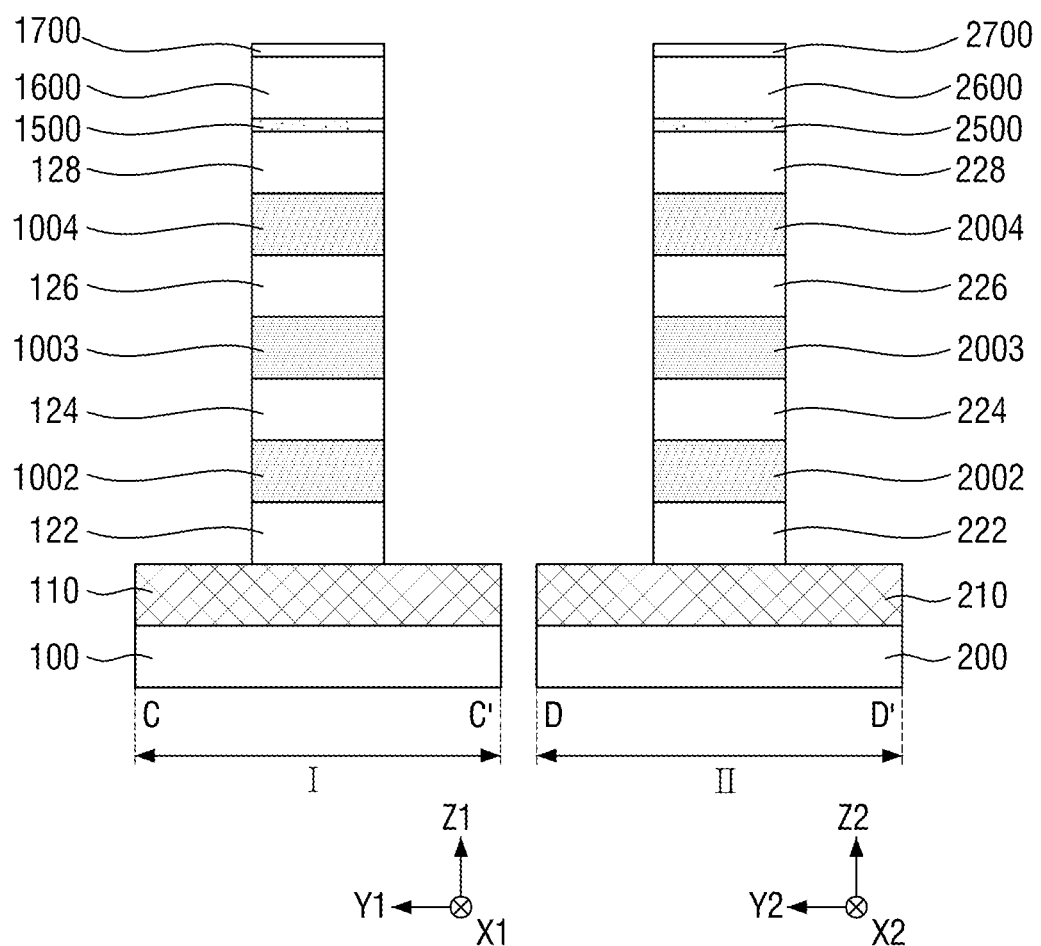

FIGS. 41 and 42 are views illustrating stages in a method for fabricating a semiconductor device according to some embodiments. For reference, FIGS. 41 and 42 are cross-sectional views taken along lines C-C' and D-D' of FIG. 8. FIG. 41 is a view subsequent to FIG. 22.

Referring to FIG. 41, a first liner layer 1700 may be formed on the first region I, and a second liner layer 2700 may be formed on the second region II. The sacrificial layer on the first region I and the sacrificial layer on the second region II may be removed.

Then, a third mask pattern may be formed on the first region I. A second pre-isolation insulating layer 210P may be formed on the second region II exposed by the third mask pattern. Accordingly, the space from which the sacrificial layer has been removed on the second region II can be filled.

Referring to FIG. 42, an etching process may be performed using, as an etching mask, the second liner layer 2700 disposed on the top surface of the second mask pattern 2600 in the second region II. Accordingly, the side surfaces of the second active patterns 222, 224, 226, and 228 and the side surfaces of the second sacrificial layers 2002, 2003, and 2004 may be exposed. Further, the second isolation insulating layer 210 may be formed.

Then, a fourth mask pattern may be formed on the second region II, and the third mask pattern on the first region I may be removed. A first pre-isolation insulating layer may be formed on the first region I exposed by the fourth mask pattern. Accordingly, the space from which the sacrificial layer has been removed on the first region I can be filled.

Then, an etching process may be performed using, as an etching mask, the first liner layer 1700 disposed on the top surface of the first mask pattern 1600 in the first region I. Accordingly, the side surfaces of the first active patterns 122, 124, 126, and 128 and the side surfaces of the first sacrificial layers 1002, 1003, and 1004 may be exposed. Further, the first isolation insulating layer [210] 110 may be formed.

Next, referring to FIGS. 27 to 31 and FIGS. 8 and 9, the first region I may include the first isolation insulating layer 110 and the first gate electrode 140 formed on the first isolation insulating layer 110, and the second region II may include the second isolation insulating layer 210 containing a material different from the material contained in the first isolation insulating layer 110 and the second gate electrode 240 formed on the second isolation insulating layer 210.

By way of summation and review, aspects of the present disclosure provide a semiconductor device with improved product reliability. Aspects of the present disclosure also provide a method for fabricating a semiconductor device with improved product reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including a first region and a second region separated from each other;
a laminate structure including at least one sacrificial layer and at least one semiconductor layer alternately stacked on the substrate;
a first isolation insulating layer on the laminate structure on the first region, the laminate structure being between the substrate and the first isolation insulating layer;
a second isolation insulating layer on the laminate structure on the second region, the laminate structure being between the substrate and the second isolation insulating layer, and the second isolation insulating layer having a substantially same thickness as the first isolation insulating layer;
a first pattern including a first upper pattern and a first lower pattern, and extending in a first direction, the first upper pattern spaced apart from the first isolation insulating layer,
the first lower pattern directly on the first isolation insulating layer, the first lower pattern being between the first isolation insulating layer and the first upper pattern;
a first gate electrode surrounding at least a portion of the first pattern and extending in a second direction crossing the first direction, the first lower pattern partially overlapping with the first gate electrode in the second direction;
a first source/drain region on a side surface of the first gate electrode;
a second pattern including a second upper pattern and a second lower pattern, and extending in the first direction, the second upper pattern spaced apart from the second isolation insulating layer,
the second lower pattern directly on the second isolation insulating layer, the second lower pattern being between the second isolation insulating layer and the second upper pattern;
a second gate electrode surrounding at least a portion of the second pattern and extending in the second direction, the second lower pattern partially overlapping with the second gate electrode in the second direction; and
a second source/drain region on a side surface of the second gate electrode,
wherein a top surface of the first isolation insulating layer and a top surface of the second isolation insulating layer are at different heights relative to a bottom of the substrate, and
wherein each of the first isolation insulating layer and the second isolation insulating layer includes a material different from the at least one sacrificial layer, the at least one semiconductor layer, the first pattern and the second pattern.

2. The semiconductor device as claimed in claim 1, wherein the at least one semiconductor layer is at an uppermost portion of the laminate structure, the first isolation insulating layer being directly on the at least one semiconductor layer.

3. The semiconductor device as claimed in claim 1, wherein:
the first upper pattern includes first sub-patterns spaced apart from each other,
the second upper pattern includes second sub-patterns spaced apart from each other,
a number of the first sub-patterns is different from a number of the second sub-patterns, and
top surfaces of the first and second gate electrodes being coplanar.

4. The semiconductor device as claimed in claim 1, wherein the at least one sacrificial layer includes silicon germanium, and the at least one semiconductor layer includes silicon.

5. The semiconductor device as claimed in claim 1, wherein the at least one sacrificial layer includes silicon, and the at least one semiconductor layer includes silicon germanium.

6. The semiconductor device as claimed in claim 1, wherein:
the at least one semiconductor layer includes a first semiconductor layer and a second semiconductor layer,
the at least one sacrificial layer includes a first sacrificial layer and a second sacrificial layer, the first semiconductor layer being between the first and second sacrificial layers, and the second sacrificial layer being between the first and second semiconductor layers, and
the first isolation insulating layer overlapping the first sacrificial layer in the second direction, and the second isolation insulating layer overlapping the second sacrificial layer in the second direction.

7. The semiconductor device as claimed in claim 6, wherein a thickness of the first isolation insulating layer is equal to a thickness of the first sacrificial layer, and a thickness of the second isolation insulating layer is equal to a thickness of the second sacrificial layer.

8. The semiconductor device as claimed in claim 6, wherein the first isolation insulating layer does not overlap the second isolation insulating layer in the second direction.

9. The semiconductor device as claimed in claim 1, wherein:
the at least one semiconductor layer includes a first semiconductor layer and a second semiconductor layer,
the at least one sacrificial layer includes a first sacrificial layer and a second sacrificial layer, the first semiconductor layer, being between the first and second sacrificial layers, and the second sacrificial layer being between the first and second semiconductor layers,
the first isolation insulating layer overlapping the first sacrificial layer the second direction, and the second isolation insulating layer overlapping the second sacrificial layer in the second direction,
a thickness of the first isolation insulating layer is greater than a thickness of the first sacrificial layer, and
a thickness of the second isolation insulating layer is greater than a thickness of the second sacrificial layer.

10. The semiconductor device as claimed in claim 9, wherein the first isolation insulating layer at least partially overlaps the second isolation insulating layer in the second direction.

11. A semiconductor device, comprising:
a substrate including a first region and a second region different from each other;
a first isolation insulating layer on the first region, an upper surface of the first isolation insulating layer comprising a first portion and a second portion;
a first lower pattern in contact with the first portion of the upper surface of the first isolation insulating layer;
a first gate electrode on the first isolation insulating layer, the first gate electrode surrounding at least a portion of the first lower pattern;
a first gate dielectric layer between the first gate electrode and the first lower pattern and between the first gate electrode and the first isolation insulating layer, the first gate dielectric layer being in direct contact with the second portion of the upper surface of the first isolation insulating layer;
a second isolation insulating layer on the second region, an upper surface of the second isolation insulating layer comprising a third portion and a fourth portion;
a second lower pattern in contact with the third portion of the upper surface of the second isolation insulating layer;
a second gate electrode on the second isolation insulating layer, the second gate electrode surrounding at least a portion of the second lower pattern; and
a second gate dielectric layer between the second gate electrode and the second lower pattern and between the second gate electrode and the second isolation insulating layer, the second gate dielectric layer being in direct contact with the fourth portion of the upper surface of the second isolation insulating layer,
wherein the first isolation insulating layer and the second isolation insulating layer include different materials.

12. The semiconductor device as claimed in claim 11, wherein a direction of stress applied to the first lower pattern by the first isolation insulating layer is different from a direction of stress applied to the second lower pattern by the second isolation insulating layer.

13. The semiconductor device as claimed in claim 12, wherein:
the first region is an NMOS region, and the second region is a PMOS region,
the first isolation insulating layer applies stress to the first lower pattern from the first isolation insulating layer, and
the second isolation insulating layer applies stress to the second isolation insulating layer from the second lower pattern.

14. The semiconductor device as claimed in claim 11, further comprising a first upper pattern spaced apart from the first lower pattern, and
a second upper pattern spaced apart from the second lower pattern.

15. The semiconductor device as claimed in claim 11, wherein the first isolation insulating layer and the second isolation insulating layer have a substantially same thickness.

16. A method for fabricating a semiconductor device, the method comprising:
forming a laminate structure including sacrificial layers and semiconductor layers that are alternately stacked on a substrate, the substrate including a first region and a second region separated from each other;
etching the laminate structure on the first region to form a first stacked structure;
removing a first sacrificial layer from the first stacked structure and forming a first isolation insulating layer in a space from which the first sacrificial layer has been removed, such that a first portion of the first stacked structure is between the substrate and the first isolation insulating layer;
etching the laminate structure on the second region to form a second stacked structure;
removing a second sacrificial layer from the second stacked structure and forming a second isolation insulating layer in a space from which the second sacrificial layer has been removed, such that the second isolation insulating layer has a substantially same thickness as the first isolation insulating layer, and a second portion of the second stacked structure is between the substrate and the second isolation insulating layer;
forming a first upper pattern spaced apart from the first isolation insulating layer;
forming a first lower pattern directly on the first isolation insulating layer, such that the first lower pattern is between the first isolation insulating layer and the first upper pattern;
forming a first gate electrode surrounding at least a portion of the first upper pattern;
forming a second upper pattern spaced apart from the second isolation insulating layer;
forming a second lower pattern directly on the second isolation insulating layer, such that the second lower pattern is between the second isolation insulating layer and the second upper pattern; and
forming a second gate electrode surrounding at least a portion of the second upper pattern;
wherein the first isolation insulating layer and the second isolation insulating layer are formed at different heights relative to a bottom of the substrate.

17. The method as claimed in claim 16, the method further comprising:
etching the laminate structure on a third region of the substrate to form a third stacked structure, the third region being separated from the first region and the second region; and
removing a third sacrificial layer from the third stacked structure and forming a third isolation insulating layer in a space from which the third sacrificial layer has been removed,
wherein the third isolation insulating layer and the second isolation insulating layer are disposed at different heights relative to the bottom of the substrate.

18. The method as claimed in claim 16, wherein the second isolation insulating layer is disposed at a same height as a sacrificial layer at an uppermost portion of the sacrificial layers under the first isolation insulating layer.

19. The method as claimed in claim 16, further comprising:
after removing the first sacrificial layer, removing first and second semiconductor layers adjacent to the first sacrificial layer of the semiconductor layers of the laminate structure on the first region;
forming the first isolation insulating layer in a space from which the first and second semiconductor layers have been removed;
after removing the second sacrificial layer, removing third and fourth semiconductor layers adjacent to the second sacrificial layer among the semiconductor layers of the laminate structure on the second region; and forming the second isolation insulating layer in a space from which the third and fourth semiconductor layers have been removed.

20. The method as claimed in claim 16, wherein:

n sacrificial layers (n being a natural number) of the sacrificial layers and n semiconductor layers of the semiconductor layers are formed under the first isolation insulating layer, m sacrificial layers (m being a natural number) of the sacrificial layers and m semiconductor layers of the semiconductor layers are disposed under the second isolation insulating layer, and n and m are different from each other.

* * * * *